(12) United States Patent
Sakurai et al.

(10) Patent No.: US 12,520,570 B2
(45) Date of Patent: Jan. 6, 2026

(54) SEMICONDUCTOR DEVICE

(71) Applicant: FUJI ELECTRIC CO., LTD., Kawasaki (JP)

(72) Inventors: Yosuke Sakurai, Azumino (JP); Akio Yamano, Matsumoto (JP); Seiji Noguchi, Matsumoto (JP); Ryutaro Hamasaki, Matsumoto (JP); Takuya Yamada, Matsumoto (JP); Daisuke Ozaki, Okaya (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 408 days.

(21) Appl. No.: 18/069,200

(22) Filed: Dec. 20, 2022

(65) Prior Publication Data

US 2023/0260991 A1    Aug. 17, 2023

(30) Foreign Application Priority Data

Feb. 17, 2022   (JP) .................................. 2022-023285

(51) Int. Cl.
*H10D 84/60* (2025.01)
*H10D 8/00* (2025.01)
(Continued)

(52) U.S. Cl.
CPC ........... *H10D 84/617* (2025.01); *H10D 8/422* (2025.01); *H10D 12/481* (2025.01); *H10D 64/117* (2025.01)

(58) Field of Classification Search
CPC .... H10D 84/617; H10D 8/422; H10D 12/481; H10D 64/117; H10D 64/232;
(Continued)

(56) References Cited

U.S. PATENT DOCUMENTS

| 2001/0054738 A1 | 12/2001 | Momota |
| 2005/0151187 A1 | 7/2005 | Otsuki |

(Continued)

FOREIGN PATENT DOCUMENTS

| JP | 2001308327 A | 11/2001 |
| JP | 2005175425 A | 6/2005 |

(Continued)

OTHER PUBLICATIONS

Office Action issued for counterpart Japanese Application No. 2022-023285, transmitted from the Japanese Patent Office on Oct. 14, 2025 (drafted on Oct. 3, 2025).

*Primary Examiner* — Mohammad A Rahman

(57) ABSTRACT

Provided is a semiconductor device in which one mesa portion of two mesa portions in contact with a gate trench portion is an active mesa portion in which an emitter region of a first conductivity type having a doping concentration higher than that of a drift region is arranged in contact with the gate trench portion, the other mesa portion of two mesa portions in contact with the gate trench portion is a dummy mesa portion having no emitter region, and a dummy contact resistance which is a resistance of the dummy mesa portion and an emitter electrode is 1000 times or more as high as an active contact resistance which is a resistance of the active mesa portion and the emitter electrode.

21 Claims, 20 Drawing Sheets

(51) Int. Cl.
*H10D 12/00* (2025.01)
*H10D 64/00* (2025.01)

(58) Field of Classification Search
CPC .. H10D 64/516; H10D 64/605; H10D 62/127; H10D 84/811; H10D 64/513; H10D 64/519
See application file for complete search history.

(56) References Cited

U.S. PATENT DOCUMENTS

| | | |
|---|---|---|
| 2018/0082996 A1 | 3/2018 | Naito |
| 2018/0204909 A1 | 7/2018 | Konishi |
| 2018/0269315 A1 | 9/2018 | Kato |
| 2020/0194574 A1 | 6/2020 | Harada |
| 2021/0351284 A1* | 11/2021 | Kubouchi ............ H10D 64/232 |
| 2021/0359088 A1* | 11/2021 | Ohi ....................... H01L 21/265 |

FOREIGN PATENT DOCUMENTS

| | | |
|---|---|---|
| JP | 2007324539 A | 12/2007 |
| JP | 2018157200 A | 10/2018 |
| JP | 2019220722 A | 12/2019 |
| JP | 2020098820 A | 6/2020 |
| WO | 2017033315 A1 | 3/2017 |
| WO | 2017099095 A1 | 6/2017 |

* cited by examiner

SEMICONDUCTOR DEVICE

The contents of the following Japanese patent application(s) are incorporated herein by reference:
No. 2022-023285 filed in JP on Feb. 17, 2022

BACKGROUND

1. Technical Field

The present invention relates to a semiconductor device.

2. Related Art

Conventionally, a semiconductor device such as an IGBT is known. (See, for example, Patent Document 1).
Patent Document 1: WO 2017/033315

BRIEF DESCRIPTION OF THE DRAWINGS

FIG. 10 illustrates an example of time waveforms of a collector-emitter voltage Vce and a gate voltage Vge of the semiconductor device 100 at time of turn-on.

FIG. 14 illustrates an example of a current (Ic)-voltage change rate (dv/dt) characteristic at the time of turn-on.

FIG. 15 illustrates an example of the current (Ic)-voltage change rate (dv/dt) characteristic at the time of turn-on.

DESCRIPTION OF EXEMPLARY EMBODIMENTS

Figure 1:
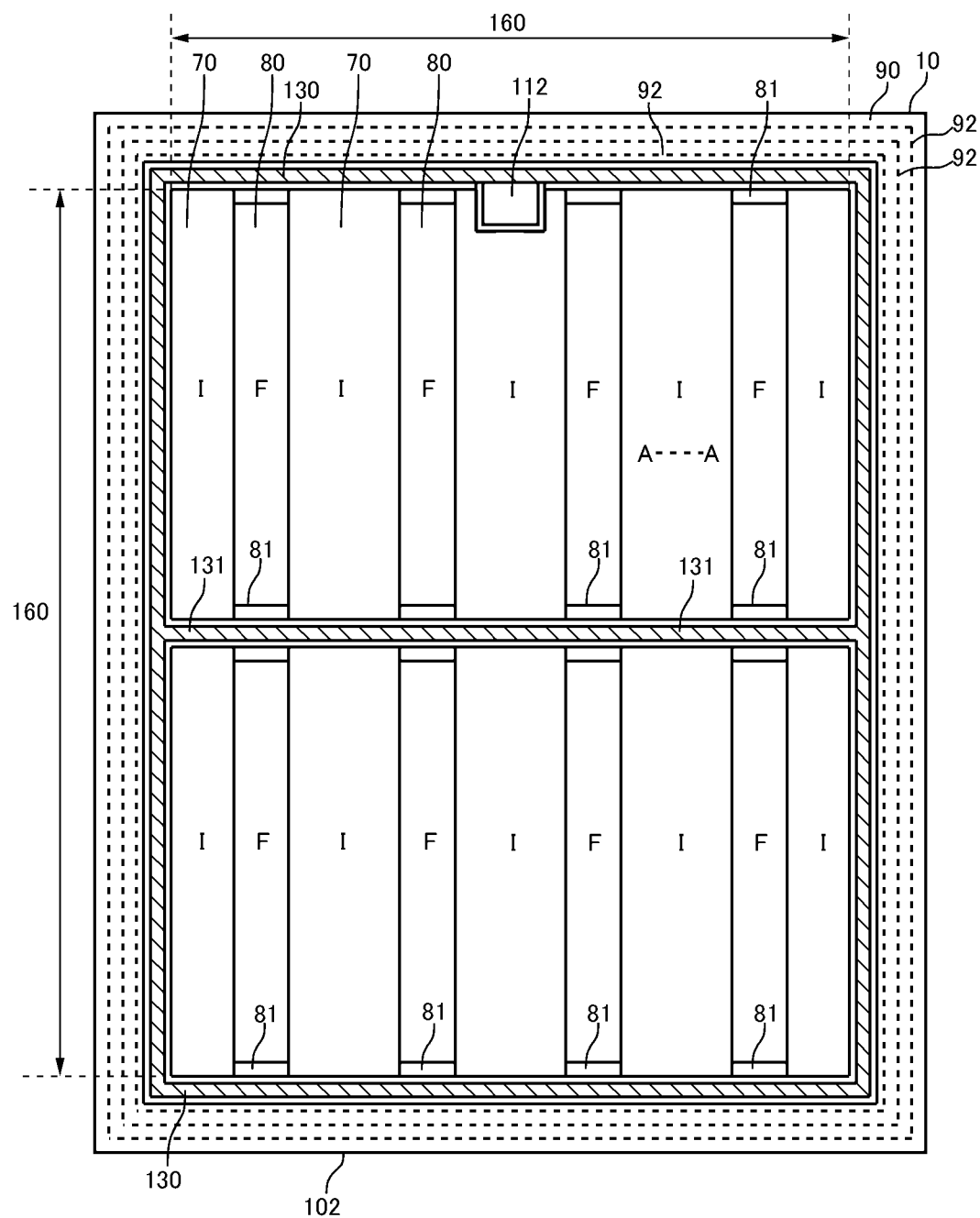
FIG. 1 is an example of a top view of a semiconductor device 100.

Hereinafter, the invention will be described through embodiments of the invention, but the following embodiments do not limit the invention according to claims. Not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. An axis perpendicular to the upper surface and the lower surface of the semiconductor substrate is referred to as the Z axis. In the present specification, the direction of the Z axis may be referred to as the depth direction. In the present specification, a direction parallel to the upper surface and the lower surface of the semiconductor substrate may be referred to as a horizontal direction, including an X axis direction and a Y axis direction. When referring to an upper surface side of the semiconductor substrate in the present specification, the upper surface side refers to a region from the center to the upper surface of the semiconductor substrate in the depth direction. When referring to a lower surface side of the semiconductor substrate, the lower surface side refers to a region from the center to the lower surface of the semiconductor substrate in the depth direction.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. The N type and the P type are examples of a first conductivity type and a second conductivity type. The N type may be the first conductivity type, and the P type may be the second conductivity type, or the P type may be the first conductivity type, and the N type may be the second conductivity type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $|N_D-N_A|$.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons.

In the present specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type.

In the present specification, a chemical concentration refers to an atomic density of an impurity measured regardless of an electrical activation state. The chemical concentration (atomic density) can be measured by, for example, secondary ion mass spectrometry (SIMS). The net doping concentration described above can be measured by voltage-capacitance profiling (CV profiling). A carrier density measured by spreading resistance profiling (SRP method) may be set as the net doping concentration. The carrier density measured by the CV profiling or the SRP method may be a value in a thermal equilibrium state. In a region of the N type, the donor concentration is sufficiently higher than the acceptor concentration, and thus the carrier density of the region may be set as the donor concentration. Similarly, in a region of the P type, the carrier density of the region may be set as the acceptor concentration.

When a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping.

The carrier density measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier density measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

In the present specification, a configuration of an insulated gate bipolar transistor (IGBT) will be described as a transistor portion, but the transistor portion may be a MOSFET. When the transistor portion is a MOSFET, in the present specification, "emitter" refers to a source of the MOSFET, and "collector" refers to a drain of the MOSFET. When the transistor portion is a MOSFET, a drain region of the N type may be provided instead of a collector region of the P type.

FIG. 1 illustrates an example of a top view of the semiconductor device 100. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. In the semiconductor substrate 10 of this example, bulk donors of the N type are distributed throughout. The bulk donor is a dopant donor substantially uniformly contained in an ingot during manufacturing of the ingot from which the semiconductor substrate 10 is made. The bulk donor of this example is an element other than hydrogen. The bulk donor dopant is, for example, an element of group V or group VI, and is, for example, phosphorous, antimony, arsenic, selenium, or sulfur, but the bulk donor dopant is not limited to these. The bulk donor of this example is phosphorous. The bulk donor is also contained in a region of the P type. The semiconductor substrate 10 may be a wafer cut out from a semiconductor ingot, or may be a chip obtained by singulating the wafer. The semiconductor ingot may be manufactured by any of a Czochralski method (CZ method), a magnetic field applied Czochralski method (MCZ method), or a float zone method (FZ method).

An oxygen chemical concentration contained in the substrate manufactured by the MCZ method is, as an example, $1\times10^{17}$ to $7\times10^{17}$ atoms/cm$^3$. The oxygen chemical concentration contained in the substrate manufactured by the FZ method is, as an example, $1\times10^{15}$ to $5\times10^{16}$ atoms/cm$^3$. The bulk donor concentration may use a chemical concentration of bulk donors distributed throughout the semiconductor substrate 10, or may be a value between 90% and 100% of the chemical concentration. In the semiconductor substrate doped with dopants, such as phosphorous, of group V and group VI, the bulk donor concentration may be $1\times10^{11}$/cm$^3$ or more and $3\times10^{13}$/cm$^3$ or less. The bulk donor concentration of the semiconductor substrate doped with the dopants of group V and group VI is preferably $1\times10^{12}$/cm$^3$ or more and $1\times10^{13}$/cm$^3$ or less. As the semiconductor substrate 10, a non-doped substrate substantially not containing a bulk dopant such as phosphorous may be used. In that case, the bulk donor concentration of the non-doped substrate is, for example, $1\times10^{10}$/cm$^3$ or more and $5\times10^{12}$/cm$^3$ or less. The bulk donor concentration of the non-doped substrate is preferably $1\times10^{11}$/cm$^3$ or more. The bulk donor concentration of the non-doped substrate is preferably $5\times10^{12}$/cm$^3$ or less.

Bulk acceptors of the P type may be distributed throughout the semiconductor substrate 10. The bulk acceptor may be a dopant acceptor substantially uniformly contained in an ingot during the manufacturing of the ingot from which the semiconductor substrate 10 is made, or may be an acceptor implanted into the entire semiconductor substrate 10 in a form of wafer or chip. The bulk acceptor may be boron. A bulk acceptor concentration may be lower than the bulk donor concentration. In other words, the bulk of the ingot or the semiconductor substrate 10 is the N type. As an example, the bulk acceptor concentration is from $5\times10^{11}$(/cm$^3$) to $8\times10^{14}$(/cm$^3$), and the bulk donor concentration is from $5\times10^{12}$(/cm$^3$) to $1\times10^{15}$(/cm$^3$). The bulk acceptor concentration may be 1% or more, 10% or more, or 50% or more of the bulk donor concentration. The bulk acceptor concentration may be 99% or less, 95% or less, or 90% or less of the bulk donor concentration. As the bulk acceptor concentration and the bulk donor concentration, chemical concentrations of impurities, such as boron or phosphorous, distributed throughout the semiconductor substrate 10 may be used. As the bulk acceptor concentration and the bulk donor concentration, values at the center in the depth direction of the semiconductor substrate 10 in the chemical concentration of impurities, such as boron or phosphorous, distributed throughout the semiconductor substrate 10 may be used.

The semiconductor substrate 10 has an upper surface and a lower surface. The upper surface and the lower surface are two principal surfaces of the semiconductor substrate 10. The semiconductor substrate 10 has an end side 102 in the top view. When merely referred to as the top view in the present specification, it means that the semiconductor substrate 10 is viewed from an upper surface side. The semiconductor substrate 10 of this example has two sets of end sides 102 opposite to each other in the top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1.

The active portion 160 is provided with a transistor portion 70 including a transistor element such as an IGBT. The active portion 160 may or may not be provided with a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10.

In FIG. 1, a region where each of the transistor portions 70 is arranged is indicated by a symbol "I", and a region where each of the diode portions 80 is arranged is indicated by a symbol "F". In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described later may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of P+ type of may be provided in a region other than the cathode region. In the specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. In the transistor portion 70, an emitter region of the N+ type, a base region of the P− type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 112. The semiconductor device 100 may have an anode pad and a cathode pad connected to a diode for temperature detection, or may have a pad for current detection. Each pad is arranged in a region close to the end side 102. The region close to the end side 102 refers to a region between the end side 102 and the emitter electrode in the top view. When the semiconductor device 100 is mounted, each pad may be connected to an external circuit via a wiring such as a wire.

A gate potential is applied to the gate pad 112. The gate pad 112 is electrically connected to a conductive portion of a gate trench portion of the active portion 160. The semiconductor device 100 includes a gate runner that connects the gate pad 112 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 102 of the semiconductor substrate 10 in the top view. The outer circumferential gate runner 130 of this example encloses the active portion 160 in the top view. A region enclosed by the outer circumferential gate runner 130 in the top view may be the active portion 160. The outer circumferential gate runner 130 is connected to the gate pad 112. The outer circumferential gate runner 130 is arranged above the semiconductor substrate 10. The gate runner may be a metal wiring including aluminum or the like, may be a wiring formed of polysilicon, or may be a laminated wiring obtained by laminating these wirings.

The active-side gate runner 131 is provided in the active portion 160. Providing the active-side gate runner 131 in the active portion 160 can reduce a variation in wiring length from the gate pad 112 for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each divided region.

The semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 102. The edge termination structure portion 90 is provided farther outward than the active portion 160 in the semiconductor substrate 10. The description outward in the semiconductor substrate 10 refers to a side closer to the end side 102. The edge termination structure portion 90 of this example is arranged between the outer circumferential gate runner 130 and the end side 102. The edge termination structure portion 90 reduces an electric field strength on the upper surface side of the semiconductor substrate 10. The edge termination structure portion 90 includes a plurality of guard rings 92. The guard ring 92 is a region of the P type in contact with the upper surface of the semiconductor substrate 10. The guard ring 92 may enclose the active portion 160 in the top view. The plurality of guard rings 92 are arranged at predetermined intervals between the outer circumferential gate runner 130 and the end side 102. The guard ring 92 arranged farther outward may enclose the guard ring 92 arranged farther inward than and immediately next to the guard ring 92 arranged farther outward. The description farther outward refers to a side closer to the end side 102, and the description farther inward refers to a side closer to the center of the semiconductor substrate 10 in the top view. By providing the plurality of guard rings 92, a depletion layer on the upper surface side of the active portion 160 can be extended outward, and the breakdown voltage of the semiconductor device 100 can be improved. The edge termination structure portion 90 may further include at least one of a field plate and a RESURF which are annularly provided to enclose the active portion 160.

Figure 2:
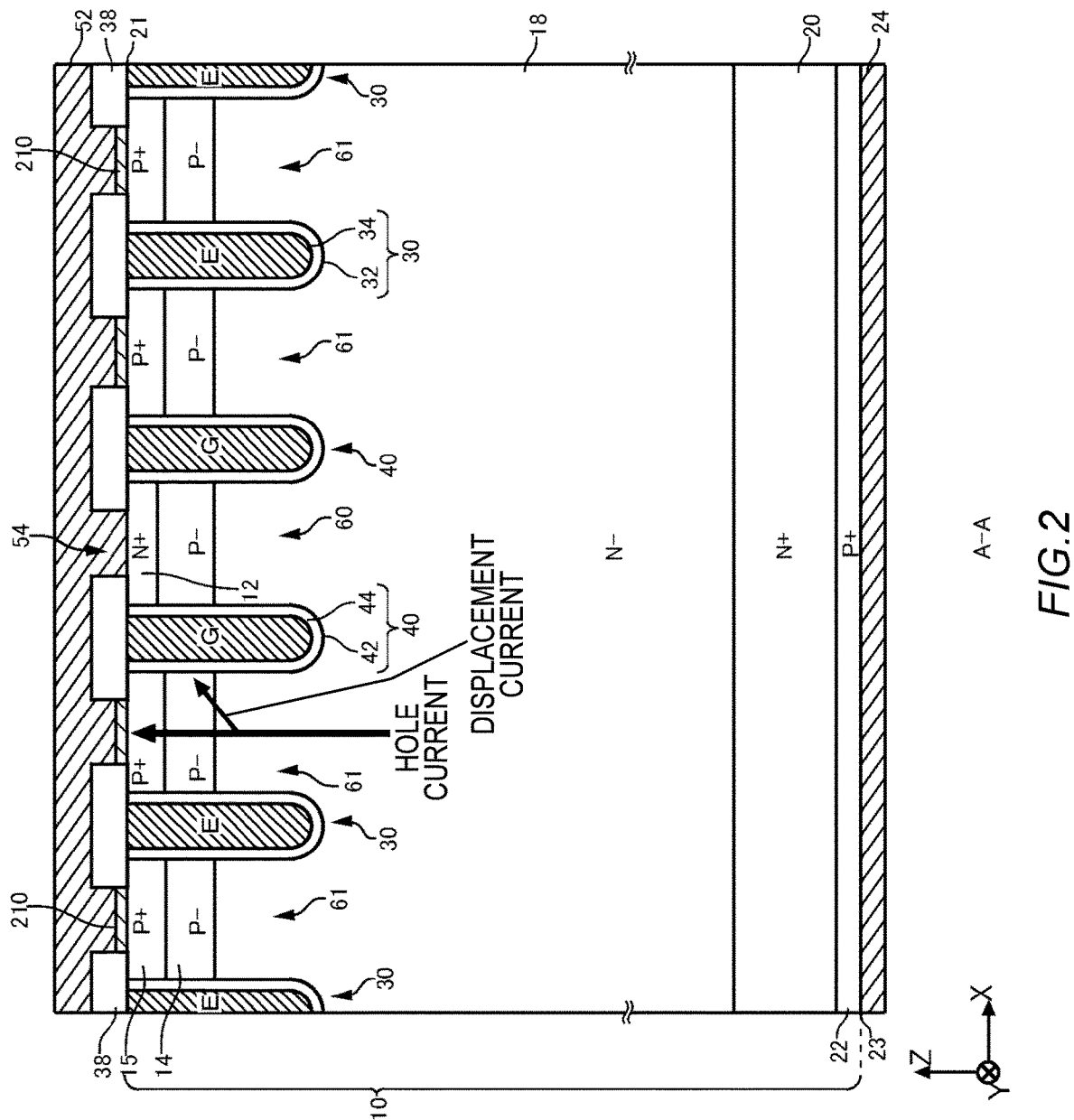
FIG. 2 illustrates an example of an A-A cross section in FIG. 1.

FIG. 2 illustrates an example of an A-A cross section in FIG. 1. The A-A cross section is an XZ plane passing through a part of the transistor portion 70. Each component illustrated in FIG. 2 is provided extending in the Y axis direction. The semiconductor device 100 of this example includes the semiconductor substrate 10, the interlayer dielectric film 38, the emitter electrode 52, and the collector electrode 24 in the cross section. The interlayer dielectric film 38 is provided on the upper surface 21 of the semiconductor substrate 10. The interlayer dielectric film 38 is a film including at least one layer of a dielectric film such as silicate glass to which an impurity such as boron or phosphorous is added, a thermal oxide film, a nitride film, and other dielectric films. The interlayer dielectric film 38 is provided with a contact hole 54 that connects the emitter electrode 52 and the semiconductor substrate 10.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The emitter electrode 52 may be in contact with the emitter region 12, the contact region 15, and the base region 14 described below. The collector electrode 24 is provided on a lower surface 23 of the semiconductor substrate 10. The emitter electrode 52 and the collector electrode 24 are formed of a metal material such as aluminum. In the specification, the direction in which the emitter electrode 52 is connected to the collector electrode 24 (the Z axis direction) is referred to as a depth direction.

The semiconductor substrate 10 includes an N− type drift region 18. The doping concentration of the drift region 18 may be identical to the bulk donor concentration or may be identical to a bulk net doping concentration which is a difference between the bulk donor concentration and the bulk acceptor concentration. In another example, the doping concentration of the drift region 18 may be higher than the bulk donor concentration or the bulk net doping concentration. The drift region 18 is provided in each of the transistor portion 70 and the diode portion 80.

In each of the transistor portion 70 and the diode portion 80, an N+ type buffer region 20 may be provided on the lower surface 23 side with respect to the drift region 18. The doping concentration of the buffer region 20 is higher than the doping concentration of the drift region 18. The buffer region 20 has one or more donor concentration peaks having donor concentrations higher than that of the drift region 18. The buffer region 20 may function as a field stopper layer which prevents a depletion layer expanding from the lower end of the base region 14 from reaching the collector region of the P+ type 22 and the cathode region of the N+ type.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron. Note that below the buffer region 20 in the diode portion 80, the cathode region of the N+ type is provided. The donor concentration of the cathode region is higher than the donor concentration of the drift region 18. The donor of the cathode region is, for example, hydrogen or phosphorous. In this example, a boundary in the X axis direction between the diode portion 80 and the transistor portion 70 is a boundary between the cathode region and the collector region 22.

Note that an element serving as a donor and an acceptor in each region is not limited to the above described example. The collector region 22 and the cathode region are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface side of the semiconductor substrate 10. In FIG. 2, the gate trench portion 40 is indicated by a symbol G, and the dummy trench portion 30 is indicated by a symbol E. The gate trench portion 40 is applied with a gate voltage to function as a gate electrode, and the dummy trench portion 30 is applied with a voltage different from the gate voltage not to function as a gate electrode. The voltage of the emitter electrode 52 is applied to the dummy trench portion 30 of this example. In the present specification, the gate trench portion 40 and the dummy trench portion 30 may be referred to as trench portions. The trench portion is provided in the depth direction from the upper surface 21 of the semiconductor substrate 10 to the drift region 18. The trench portion extends in the extending direction (Y axis direction) on the upper surface 21 of the semiconductor substrate 10. The trench portions are arranged spaced from each other in the array direction.

The gate trench portion 40 includes a groove-shaped gate trench provided in the upper surface 21 of the semiconductor substrate 10, a gate dielectric film 42, and a gate conductive portion 44. The gate trench portion 40 is an example of a gate structure. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad. For example, the dummy conductive portion 34 may be connected to a dummy pad (not illustrated) connected to an external circuit different from the gate pad, and control different from that of the gate conductive portion 44 may be performed. The dummy conductive portion 34 may be electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 in the cross section are covered with the interlayer dielectric film 38 on the upper surface 21 of the semiconductor substrate 10. As described above, the gate trench portion 40 may be connected to the gate runner at any position, and the dummy trench portion 30 may be connected to a wiring different from the gate runner at any position or may be connected to the emitter electrode 52. That is, the dummy trench portion 30 may be controlled to have a potential different from that of the gate trench portion 40, or may be controlled to have the same potential as that of the emitter electrode 52.

The transistor portion 70 has a plurality of trench portions arranged in the array direction. In the transistor portion 70 of this example, one or more gate trench portions 40 and one or more dummy trench portions 30 are alternately provided along the array direction. In the example of FIG. 2, two gate trench portions 40 and two dummy trench portions 30 are alternately provided in the array direction, but the arrangement of the trench portions is not limited thereto. One gate trench portion 40 and one dummy trench portion 30 may be alternately provided in the array direction, or two gate trench portions 40 and three or more dummy trench portions 30 may be alternately provided in the array direction. Note that in the diode portion 80 illustrated in FIG. 1, a plurality of dummy trench portions 30 may be provided along the array direction. The gate trench portion 40 may not be provided in the diode portion 80.

A mesa portion is provided between the respective trench portions in the array direction. The mesa portion refers to a region sandwiched between two trench portions adjacent to each other in the array direction inside the semiconductor substrate 10. As an example, the upper end of the mesa portion is the upper surface of the semiconductor substrate 10. The depth position of the lower end of the mesa portion is the same as the depth position of the lower end of the trench portion. The mesa portion of this example is provided extending in the extending direction (Y axis direction) along the trench on the upper surface of the semiconductor substrate 10. The transistor portion 70 of this example is provided with one or more active mesa portions 60 and one or more dummy mesa portions 61. The diode portion 80 may be provided with one or more dummy mesa portions 61. In the case of simply mentioning "mesa portion" in the present specification, the mesa portion refers to each of the active mesa portion 60 and the dummy mesa portion 61.

The active mesa portion 60 is a mesa portion in which, when the transistor portion 70 is turned on, a channel region is formed on the surface layer of the base region 14 which is a boundary with the gate trench portion 40 and a current flows between the emitter region 12 and the drift region 18. The active mesa portion 60 is in contact with at least one gate trench portion 40. The active mesa portion 60 in FIG. 2 is sandwiched between two gate trench portions 40, but, in another example, may be sandwiched between the gate trench portion 40 and the dummy trench portion 30. In the active mesa portion 60, the emitter region 12 of N+ type and the base region 14 of P− type are provided in order from the upper surface 21 side of the semiconductor substrate 10. The drift region 18 of the N− type is provided below the base region 14.

The emitter region 12 is exposed on the upper surface 21 of the semiconductor substrate 10 and is provided in contact with the gate trench portion 40. The emitter region 12 may be in contact with the trench portions on both sides of the active mesa portion 60. The emitter region 12 has a higher doping concentration than that of the drift region 18.

The base region 14 is provided below the emitter region 12. The base region 14 of this example is provided in contact with the emitter region 12. The base region 14 may be in contact with the trench portions on both sides of the active mesa portion 60. When a predetermined gate voltage is applied to the gate trench portion 40, a channel is formed by an electron inversion layer in a surface layer of the base region 14 at a boundary in contact with the gate trench portion 40.

The dummy mesa portion 61 is not provided with the emitter region 12 in contact with the gate trench portion 40. In the dummy mesa portion 61 of this example, the emitter region 12 is not provided even at a position away from the gate trench portion 40. In the dummy mesa portion 61, even when a predetermined on-voltage is applied to the gate trench portion 40, no current flows between the emitter region 12 and the drift region 18. The dummy mesa portion 61 is provided with a region of the P type in contact with the upper surface 21 of the semiconductor substrate 10. The region of the P type may be the base region 14, or may be a region having a doping concentration different from that of the base region 14. In the example of FIG. 2, the contact region 15 of the P+ type having a doping concentration higher than that of the base region 14 is provided in contact with the upper surface 21. The drift region 18 is provided below the base region 14. The dummy mesa portion 61 of this example is sandwiched between the gate trench portion 40 and the dummy trench portion 30. The mesa portion sandwiched between two dummy trench portions 30 may also be the dummy mesa portion 61.

The active mesa portion 60 may be provided with the contact region 15 exposed on the upper surface 21 of the semiconductor substrate 10. For example, in the active mesa portion 60, the contact regions 15 and the emitter regions 12 may be alternately arranged along the Y axis direction.

One mesa portion of two mesa portions in contact with at least one gate trench portion 40 is the active mesa portion 60, and the other mesa portion is the dummy mesa portion 61. In FIG. 2, each of a plurality of gate trench portions 40 is in contact with both the active mesa portion 60 and the dummy mesa portion 61. All of the gate trench portions 40 provided in the transistor portion 70 may be in contact with both the active mesa portion 60 and the dummy mesa portion 61.

A contact resistance between one active mesa portion 60 and the emitter electrode 52 is defined as an active contact resistance R1. The active contact resistance R1 may be a contact resistance between the emitter electrode 52 and a P type region provided in the active mesa portion 60. The P type region in this example is the contact region 15. Alternatively, the active contact resistance R1 may be a contact resistance between the emitter electrode 52 and the emitter region 12 provided in the active mesa portion 60. The active contact resistance R1 in this example is a contact resistance between the emitter electrode 52 and the contact region 15 provided in the active mesa portion 60. A contact resistance between one dummy mesa portion 61 and the emitter electrode 52 is defined as a dummy contact resistance R2. The dummy contact resistance R2 may be a contact resistance between the emitter electrode 52 and a P type region provided in the dummy mesa portion 61. The P type region in this example is the contact region 15. The dummy contact resistance R2 in this example is 1000 times or more the active contact resistance R1.

In this example, a resistance film 210 is provided between each dummy mesa portion 61 and the emitter electrode 52 to increase the dummy contact resistance R2. The resistance film 210 is in contact with at least a part of the upper surface of the dummy mesa portion 61 in the contact hole 54. The resistance film 210 is formed of a material having a volume resistivity higher than that of the emitter electrode 52. The resistance film 210 is formed of a material having a volume resistivity lower than that of the interlayer dielectric film 38. For example, the emitter electrode 52 is a metal electrode containing aluminum, and the resistance film 210 is a polysilicon film doped with impurities. The entire resistance film 210 may be arranged inside the contact hole 54 as illustrated in FIG. 2. A part of the resistance film 210 may be arranged above the upper end of the contact hole 54. The resistance film 210 may cover a part of the interlayer dielectric film 38. By using the resistance film 210, the dummy contact resistance R2 of the dummy mesa portion 61 can be easily increased.

When the transistor portion 70 is turned on, a turn-on loss occurs. In particular, when a large collector current flows through the transistor portion 70, a large turn-on loss occurs. The turn-on loss can be reduced by accelerating the turn-on. For example, by reducing the gate resistance to the gate conductive portion 44, the turn-on can be accelerated to reduce the turn-on loss. However, when the gate resistance is reduced, the turn-on at the time of a small current is also accelerated, and radiated noise or the like occurs.

In this example, by increasing the dummy contact resistance R2, the turn-on loss when a large collector current flows is reduced. A hole current flowing into the dummy mesa portion 61 at the time of turn-on normally passes through the dummy mesa portion 61 to the emitter electrode 52. By increasing the dummy contact resistance R2, the hole current to the emitter electrode 52 is inhibited, and a part of the hole current flowing through the dummy mesa portion 61 flows into the active mesa portion 60 along the side wall and the bottom surface of the gate trench portion 40. Such a flow of the hole current generates a displacement current in the gate conductive portion 44. The potential of the gate conductive portion 44 rises due to the displacement current generated in the gate conductive portion 44, the formation of the channel region is promoted, and the turn-on of the active mesa portion 60 is accelerated. As the collector current increases, the amount of the holes flowing into the active mesa portion 60 increases, and the turn-on is remarkably accelerated. Thus, it is possible to reduce the turn-on loss by accelerating the turn-on at the time of a large current while suppressing the occurrence of radiated noise or the like without accelerating the turn-on at the time of a small current.

The dummy contact resistance R2 may be 5000 times or more, 10000 times or more, 30000 times or more, or 50000 times or more the active contact resistance R1. Note that when the dummy contact resistance R2 is excessively large, the withdrawal of the hole current from the dummy mesa portion 61 to the emitter electrode 52 is suppressed excessively, and for example, the turn-off is delayed. The dummy contact resistance R2 may be 100000 times or less the active contact resistance R1. The dummy contact resistance R2 may be 90000 times or less or 80000 times or less the active contact resistance R1.

Figure 3:
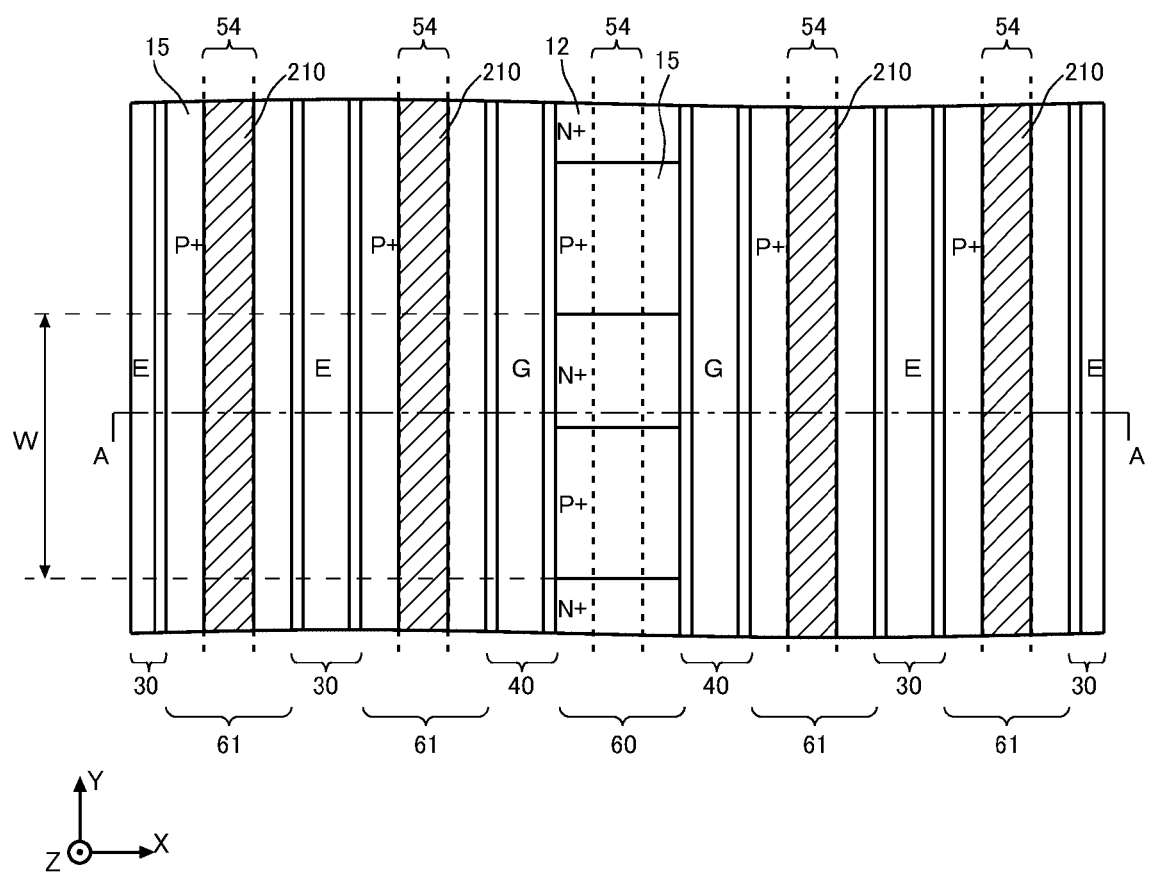
FIG. 3 illustrates an arrangement example of a resistance film 210 in a top view.

FIG. 3 illustrates an arrangement example of the resistance film 210 in the top view. FIG. 3 illustrates a top view of the active mesa portion 60, the dummy mesa portion 61, the gate trench portion 40, and the dummy trench portion 30 illustrated in FIG. 2. FIG. 3 illustrates a partial range of these configurations in the Y axis direction. FIG. 2 illustrates a cross section taken along line A-A in FIG. 3. In FIG. 3, hatching the gate conductive portion 44 and the dummy conductive portion 34 with diagonal lines is omitted, and the resistance film 210 is hatched with diagonal lines.

The emitter region 12 is exposed on the upper surface of the active mesa portion 60. The contact region 15 of the P+ type may be exposed on the upper surface of the active mesa portion 60. The emitter region 12 and the contact region 15 may be alternately arranged along the extending direction (Y axis direction) of the active mesa portion 60 and the gate trench portion 40. In another example, the emitter region 12 may extend along the gate trench portion 40 in the Y axis direction. The contact region 15 may be arranged at the center of the active mesa portion 60 in the X axis direction and extend in the Y axis direction. That is, the emitter region 12 and the contact region 15 may be arranged in a stripe shape such that the Y axis direction becomes longer.

The upper surface of the active mesa portion 60 is connected to the emitter electrode 52 via the contact hole 54. The contact hole 54 may expose the center of the active mesa portion 60 in the X axis direction. The contact hole 54 may be provided to extend along the Y axis direction. The contact hole 54 may be provided continuously from the emitter region 12 arranged at one end in the Y axis direction to the emitter region 12 arranged at the other end among a plurality of emitter regions 12.

A region of the P type is exposed on the upper surface of the dummy mesa portion 61. The region of the P type in this example is the contact region 15. The doping concentration of the contact region 15 of the dummy mesa portion 61 may be the same as or different from the doping concentration of the contact region 15 of the active mesa portion 60. The contact region 15 of the dummy mesa portion 61 may be provided continuously from a position opposing the emitter region 12 arranged at one end in the Y axis direction to a position opposing the emitter region 12 arranged at the other end among the plurality of emitter regions 12 of the active mesa portion 60.

The contact hole 54 of the dummy mesa portion 61 in this example may have a width in the X axis direction and a length in the Y axis direction similar to those of the contact hole 54 of the active mesa portion 60. The contact hole 54 of the dummy mesa portion 61 may be provided in a range overlapping with the contact region 15.

The resistance film 210 is provided inside the contact hole 54 of the dummy mesa portion 61. The resistance film 210 may be provided in the dummy mesa portion 61 adjacent to the active mesa portion 60. The resistance film 210 may also be provided in the dummy mesa portion 61 not adjacent to the active mesa portion 60. The resistance film 210 may have the same width in the X axis direction and the same length in the Y axis direction as the contact hole 54. That is, the resistance film 210 may be provided on the entire bottom surface of the contact hole 54 of the dummy mesa portion 61. In another example, the resistance film 210 may be provided only on a part of the bottom surface of the contact hole 54 of the dummy mesa portion 61.

The resistance values of the mesa portion in the same length range W in the Y axis direction may be used as the active contact resistance R1 of the active mesa portion 60 and the dummy contact resistance R2 of the dummy mesa portion 61. The length range W includes at least one emitter region 12 of the active mesa portion 60. Further, the length range W includes a region where the resistance film 210 is provided. The length range W may be a range including one or more emitter regions 12 and one or more contact regions 15 of the active mesa portion 60. The length range W may be a continuous region from the emitter region 12 arranged at one end in the Y axis direction to the emitter region 12 arranged at the other end among the plurality of emitter regions 12 of the active mesa portion 60. That is, the length range W may be a range including all the emitter regions 12 in the Y axis direction. The length range W may be a unit length in one emitter region 12 among the plurality of emitter regions 12 of the active mesa portion 60. The unit length is, as an example, 1 µm, but is not limited thereto.

The contact resistance may be a resistance value per unit area on the upper surface of the mesa portion. Also in this case, resistance values per unit area in the same length range W in the Y axis direction may be used as the active contact resistance R1 of the active mesa portion 60 and the dummy contact resistance R2 of the dummy mesa portion 61.

A contact resistance $R(\Omega)$ may be given by the following formula.

$$R = R_0 \times L/S$$

where $R_0$ is the resistivity ($\Omega \cdot cm$) of the resistance portion, L is the length (cm) of the resistance portion in a direction in which the current flows, and S is the cross-sectional area ($cm^2$) of the resistance portion in a direction perpendicular to the direction in which the current flows. The dummy contact resistance R2 of this example may be calculated from the resistivity $R_0$, the length L in the Z axis direction, and the area S in the XY plane of the resistance film 210. The active contact resistance R1 may be calculated from the resistivity $R_0$, the length L in the Z axis direction, and the area S in the XY plane of the emitter electrode 52 having the same magnitude as the resistance film 210.

Figure 4:
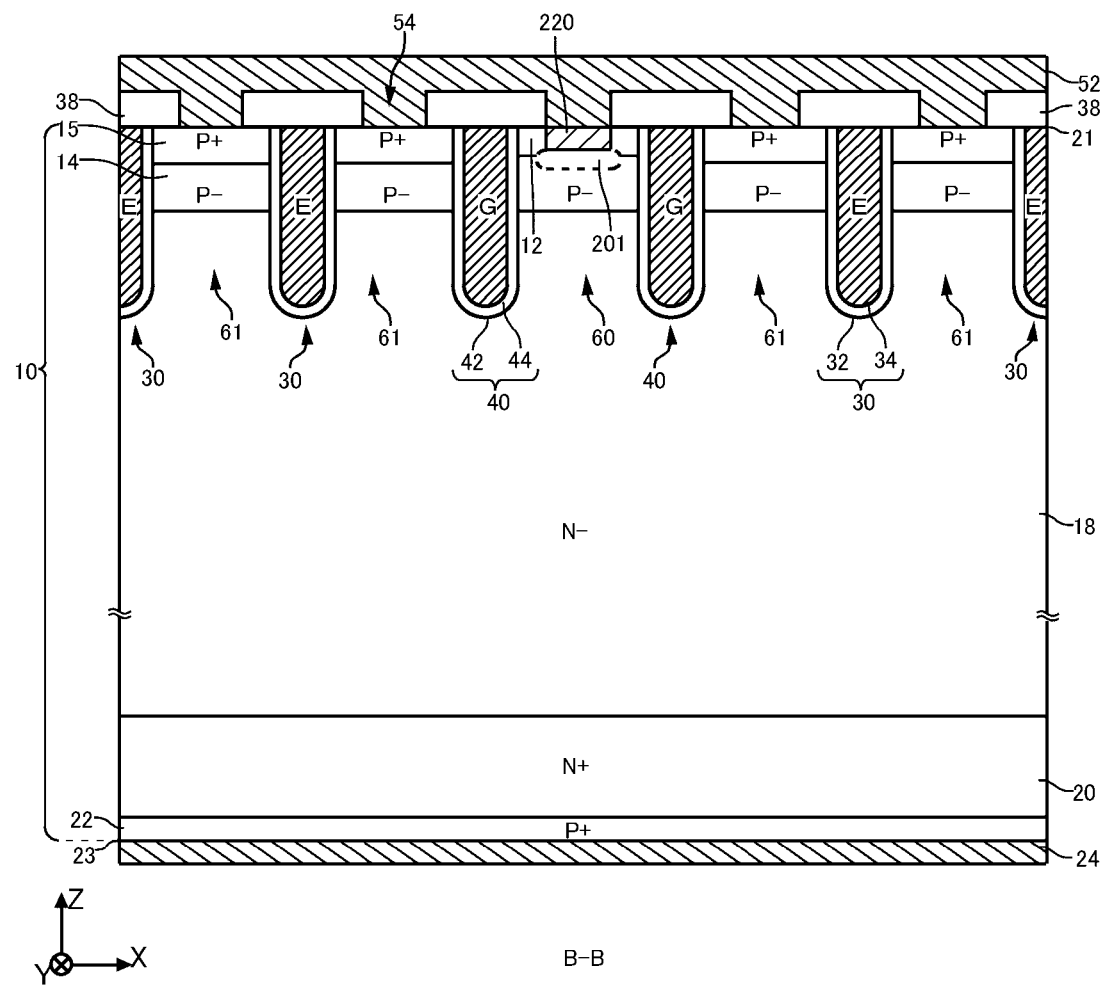
FIG. 4 illustrates another example of a cross section of a transistor portion 70.

FIG. 4 illustrates another example of the cross section of the transistor portion 70. The transistor portion 70 of this example is different from the transistor portion 70 illustrated in FIGS. 2 and 3 in that a trench contact 220 is further provided. Other structures are similar to those of any of the aspects described in FIGS. 2 and 3. Although the transistor portion 70 of this example does not have the resistance film 210, the transistor portion 70 may have the resistance film 210.

The trench contact 220 is provided in the active mesa portion 60. The dummy mesa portion 61 is not provided with the trench contact 220. That is, the upper surface 21 of the semiconductor substrate 10 of the dummy mesa portion 61 may be flat. The trench contact 220 is a conductive member connected to the emitter electrode 52. The trench contact 220 may be formed of the same material as that of the emitter electrode 52, or may be formed of a different material. The trench contact 220 may have a tungsten plug, or may include a barrier metal of titanium or titanium nitride. A plug contact region 201 of the P type may be formed to be in contact with the bottom surface of the trench contact 220. The doping concentration of the plug contact region 201 may be higher than that of the base region 14 or may be higher than that of the contact region 15. The plug contact region 201 may or may not be connected to the base region 14.

The trench contact 220 is provided from the upper surface 21 of the semiconductor substrate 10 into the semiconductor substrate 10. The trench contact 220 may be entirely provided inside the emitter region 12, or may pass through the emitter region 12 to reach the base region 14. By providing the trench contact 220, the contact area between the active mesa portion 60 and the electrode increases. Further, the trench contact 220 may be formed by filling a material having a smaller contact resistance to the semiconductor substrate 10 than the emitter electrode 52. By providing the trench contact 220, the active contact resistance R1 can be reduced to relatively increase the dummy contact resistance R2. By providing the plug contact region 201, the active contact resistance R1 can be also reduced further to relatively increase the dummy contact resistance R2. Also with such a configuration, it is possible to suppress radiated noise or the like at the time of a small current while reducing switching loss at the time of a large current.

Figure 5:
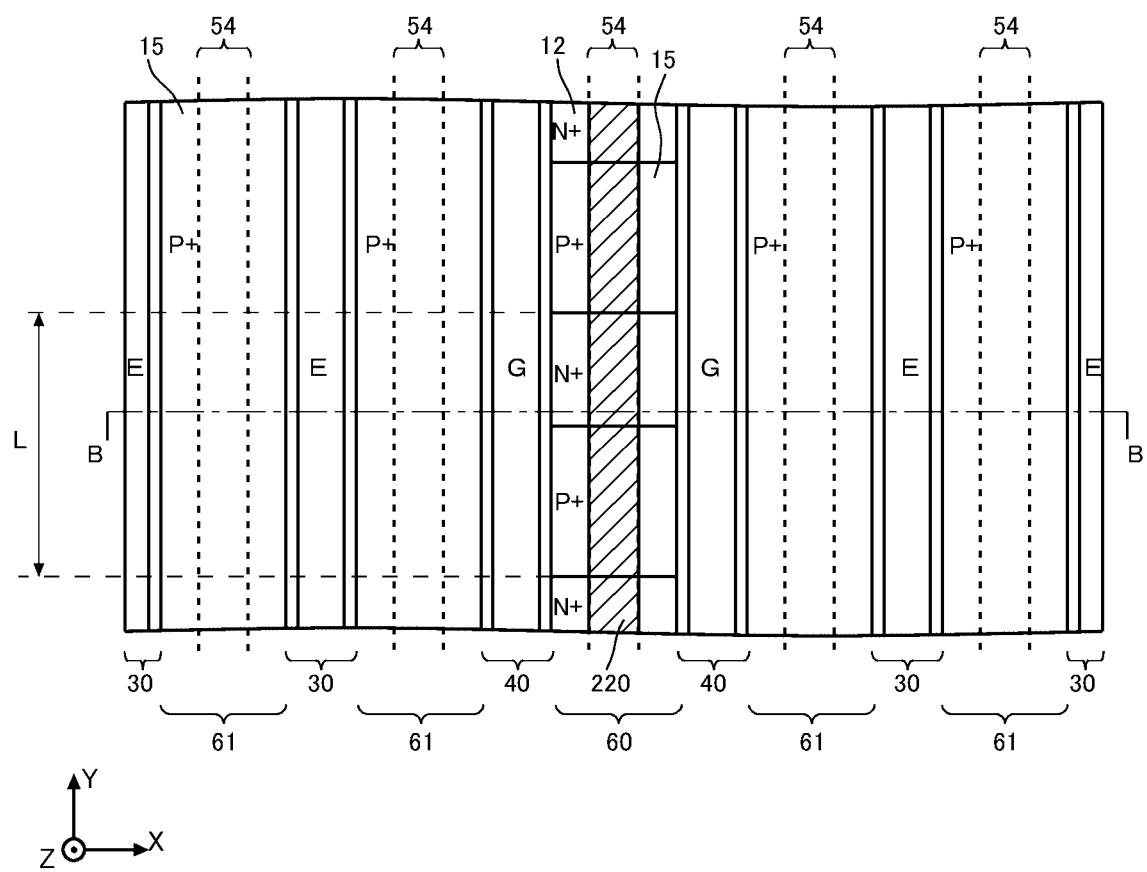
FIG. 5 illustrates an arrangement example of a trench contact 220 in the top view.

FIG. 5 illustrates an arrangement example of the trench contact 220 in the top view. FIG. 5 illustrates a top view of the active mesa portion 60, the dummy mesa portion 61, the gate trench portion 40, and the dummy trench portion 30 illustrated in FIG. 4. FIG. 5 illustrates a partial range of these configurations in the Y axis direction. FIG. 4 illustrates a cross section taken along line B-B in FIG. 5. In FIG. 5, hatching the gate conductive portion 44 and the dummy conductive portion 34 with diagonal lines is omitted, and the trench contact 220 is hatched with diagonal lines.

The configuration other than the trench contact 220 is similar to that of the example illustrated in FIG. 3. As described above, the resistance film 210 may or may not be provided in the dummy mesa portion 61. The trench contact 220 is connected to the contact hole 54 of the active mesa portion 60. The width in the X axis direction and the length in the Y axis direction of the trench contact 220 may be the same as those of the contact hole 54. That is, the trench contact 220 may be provided on the entire bottom surface of the contact hole 54 of the active mesa portion 60. In another example, the trench contact 220 may be provided only on a part of the bottom surface of the contact hole 54 of the active mesa portion 60. The width of the trench contact 220 in the X axis direction may be smaller or larger than that of the contact hole 54.

The active contact resistance R1 may be calculated from the material of the semiconductor substrate 10, the doping concentration on the upper surface of the active mesa portion 60, the material of the trench contact 220, the contact area with the semiconductor substrate 10, and the like. The dummy contact resistance R2 may be calculated from the material of the semiconductor substrate 10, the doping concentration on the upper surface of the dummy mesa portion 61, the material of the emitter electrode 52, the contact area with the semiconductor substrate 10, and the like.

Figure 6:
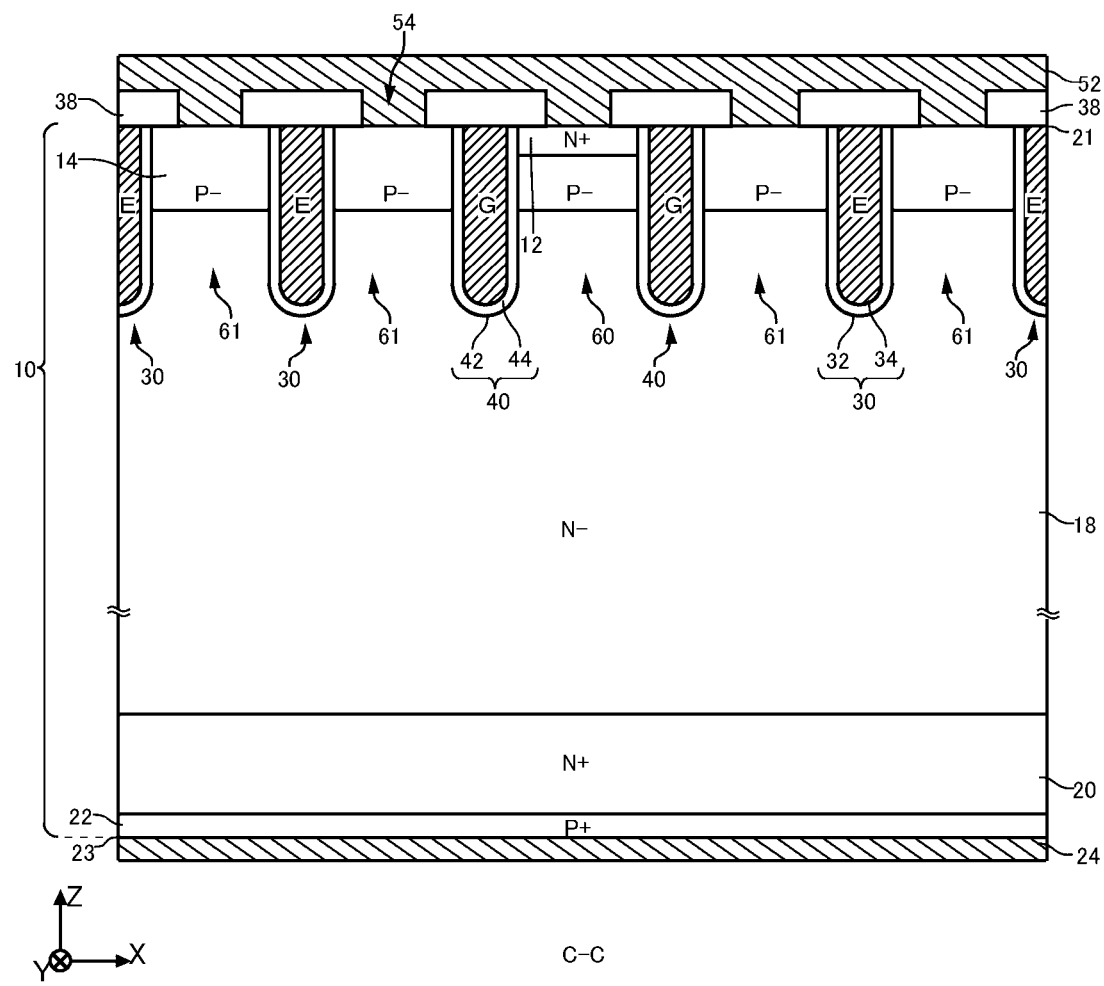
FIG. 6 illustrates another example of the cross section of the transistor portion 70.

FIG. 6 illustrates another example of the cross section of the transistor portion 70. The transistor portion 70 of this example is different from the transistor portion 70 illustrated in FIGS. 2 to 5 in the region exposed on the upper surface of the dummy mesa portion 61. Other structures are similar to those of any of the aspects described in FIGS. 2 to 5. Although the transistor portion 70 of this example does not have the resistance film 210 and the trench contact 220, the transistor portion 70 may have at least one of the resistance film 210 or the trench contact 220.

As described above, the region of the P type is exposed on the upper surface of the dummy mesa portion 61. On the upper surface of the active mesa portion 60, the contact region 15 (see FIGS. 3 and 5) having a higher doping concentration than the region of the P type of the dummy mesa portion 61 is exposed. The base region 14 is exposed on the upper surface of the dummy mesa portion 61 of this example. In another example, on the upper surface of the dummy mesa portion 61, a region having a higher doping concentration than the base region 14 may be exposed, or a region having a lower doping concentration than the base region 14 may be exposed.

By making the doping concentration of the P type region on the upper surface of the dummy mesa portion 61 lower than that of the contact region 15, a contact resistance between the dummy mesa portion 61 and the emitter electrode 52 can be increased. By making the doping concentration of the base region 14 of the dummy mesa portion 61 lower than the doping concentration of the base region 14 of the active mesa portion 60, the doping concentration of the P type region on the upper surface of the dummy mesa portion 61 may be 1/1000 or less or 1/10000 or less of the doping concentration of the contact region 15 on the upper surface of the active mesa portion 60. Also with such a configuration, it is possible to suppress radiated noise or the like at the time of a small current while reducing switching loss at the time of a large current.

Figure 7:
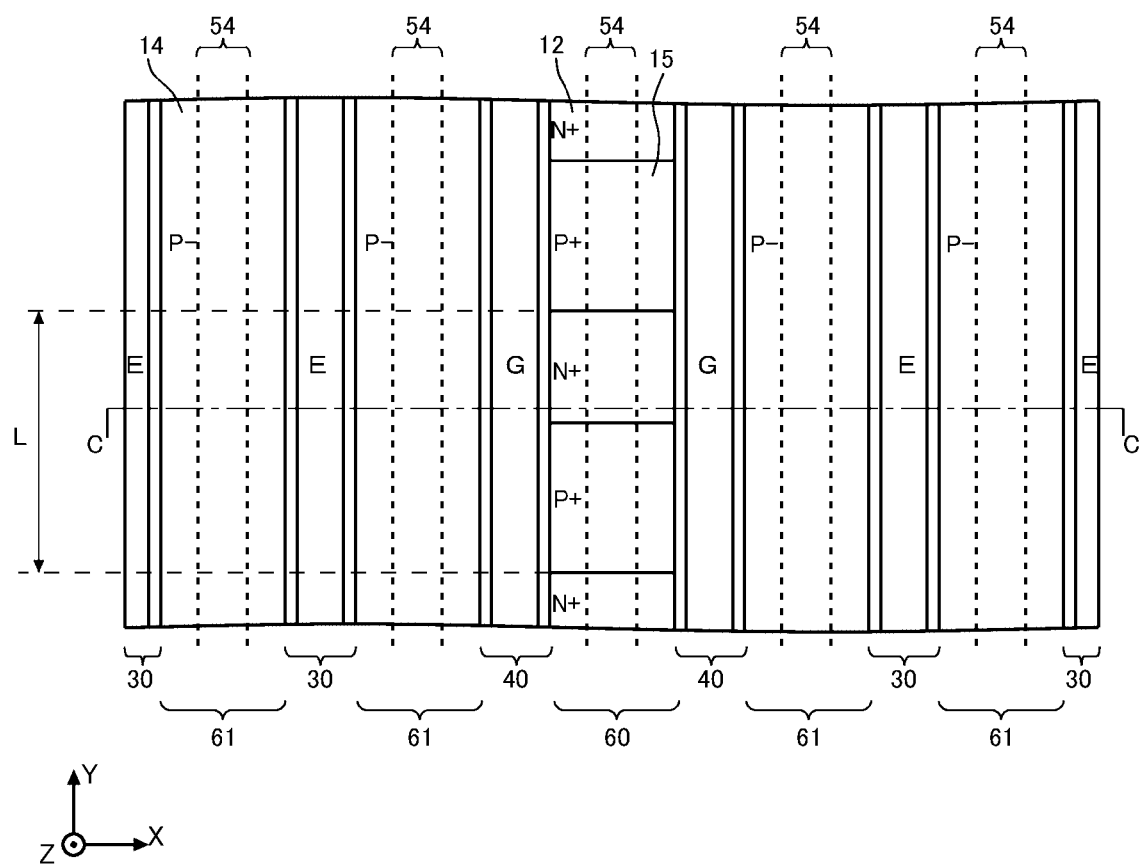
FIG. 7 illustrates an arrangement example of P type regions of dummy mesa portions 61 in the top view.

FIG. 7 illustrates an arrangement example of the P type regions of the dummy mesa portions 61 in the top view. FIG. 7 illustrates a top view of the active mesa portion 60, the dummy mesa portion 61, the gate trench portion 40, and the dummy trench portion 30 illustrated in FIG. 6. FIG. 7 illustrates a partial range of these configurations in the Y axis direction. FIG. 6 illustrates a cross section taken along line C-C in FIG. 7. In FIG. 7, hatching the gate conductive portion 44 and the dummy conductive portion 34 with diagonal lines is omitted.

The configuration other than the upper surface of the dummy mesa portion 61 is similar to that of the example illustrated in FIG. 3 or FIG. 5. As described above, the resistance film 210 may or may not be provided in the dummy mesa portion 61. The trench contact 220 may or may not be provided in the active mesa portion 60.

The base region 14 is exposed on the upper surface of the dummy mesa portion 61 of this example. The base region 14 is connected to the contact hole 54 of the dummy mesa portion 61. The base region 14 may be provided in a range which is the same as or wider than the contact hole 54 in the Y axis direction. In another example, the base region 14 may be provided in a range narrower than the contact hole 54 in the Y axis direction. The base region 14 of the dummy mesa portion 61 may be continuously provided from a position opposing the contact region 15 arranged at one end in the Y axis direction to a position opposing the contact region 15 arranged at the other end among the plurality of contact regions 15 of the active mesa portion 60. On the upper surface of the dummy mesa portion 61, the contact region 15 may be provided in a region where the base region 14 is not provided. As described above, instead of the base region 14, the P type region having a lower doping concentration than the base region 14 may be exposed on the upper surface of the dummy mesa portion 61, or the P type region having a higher doping concentration than the base region 14 may be exposed.

The active contact resistance R1 may be calculated from the material of the semiconductor substrate 10, the doping concentration on the upper surface of the active mesa portion 60, the material of the trench contact 220, the contact area with the semiconductor substrate 10, and the like. The dummy contact resistance R2 may be calculated from the material of the semiconductor substrate 10, the doping concentration on the upper surface of the dummy mesa portion 61, the material of the emitter electrode 52, the contact area with the semiconductor substrate 10, and the like.

Figure 8:
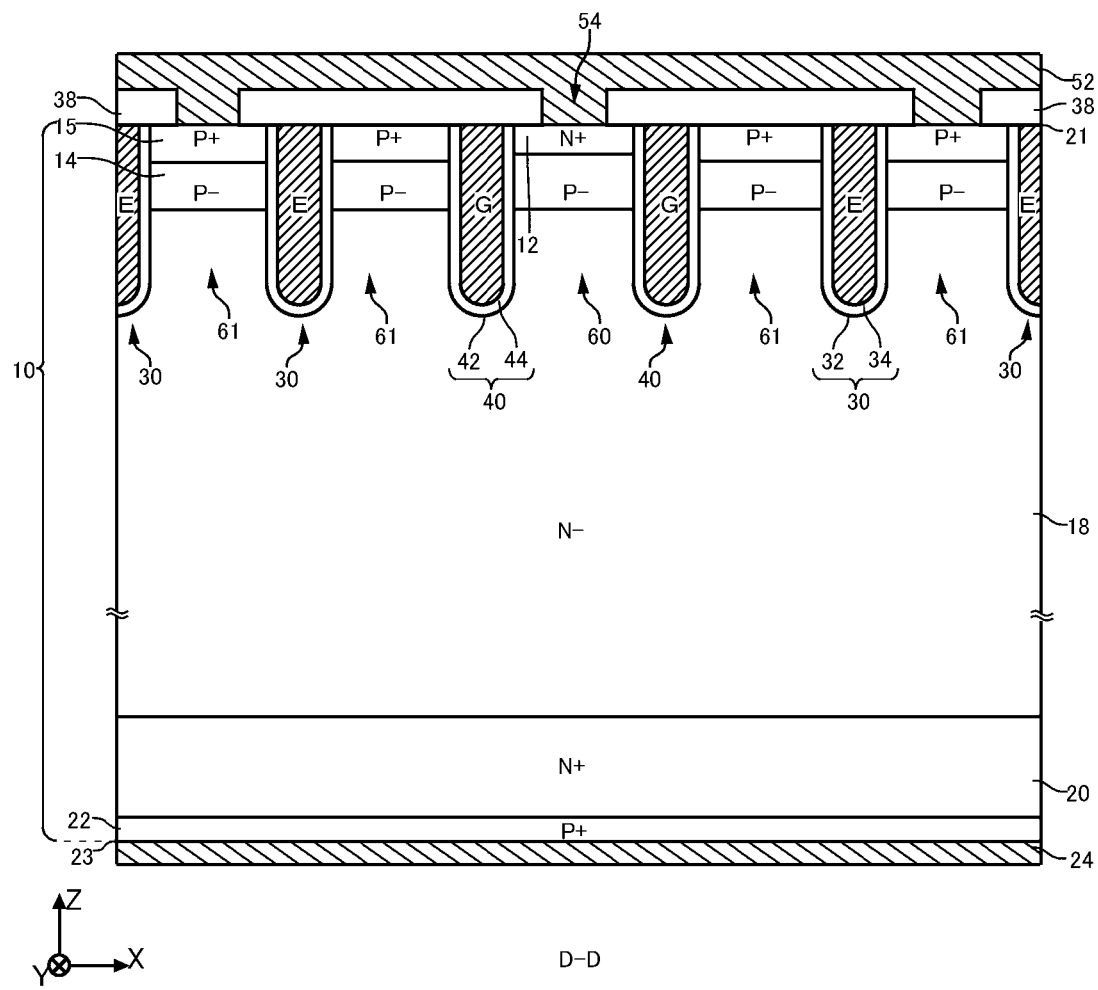
FIG. 8 illustrates another example of the cross section of the transistor portion 70.

FIG. 8 illustrates another example of the cross section of the transistor portion 70. The transistor portion 70 of this example is different from the transistor portion 70 illustrated in FIGS. 2 to 7 in the arrangement of the contact holes 54 of the dummy mesa portions 61. Other structures are similar to those of any of the aspects described in FIGS. 2 to 7. Although the transistor portion 70 of this example does not have the resistance film 210 and the trench contact 220, the transistor portion 70 may have at least one of the resistance film 210 or the trench contact 220. On the upper surface of the dummy mesa portion 61 of this example, the contact region 15 may be exposed, or a region having a lower doping concentration than the contact region 15 may be exposed similarly to the example of FIGS. 6 and 7.

In this example, the total area of the contact holes 54 for one dummy mesa portion 61 in the top view is smaller than the total area of the contact holes 54 for one active mesa portion 60 in the top view. In the cross section of FIG. 8, the contact hole 54 is provided for the active mesa portion 60, but no contact hole 54 is provided for the dummy mesa portions 61 adjacent to the active mesa portion 60.

Also with such a configuration, the dummy contact resistance R2 of the dummy mesa portion 61 can be increased. A ratio between the area of the contact hole 54 in the dummy mesa portion 61 and the area of the contact hole 54 in the active mesa portion 60 may be a resistance ratio between the dummy contact resistance R2 and the active contact resistance R1.

Figure 9:
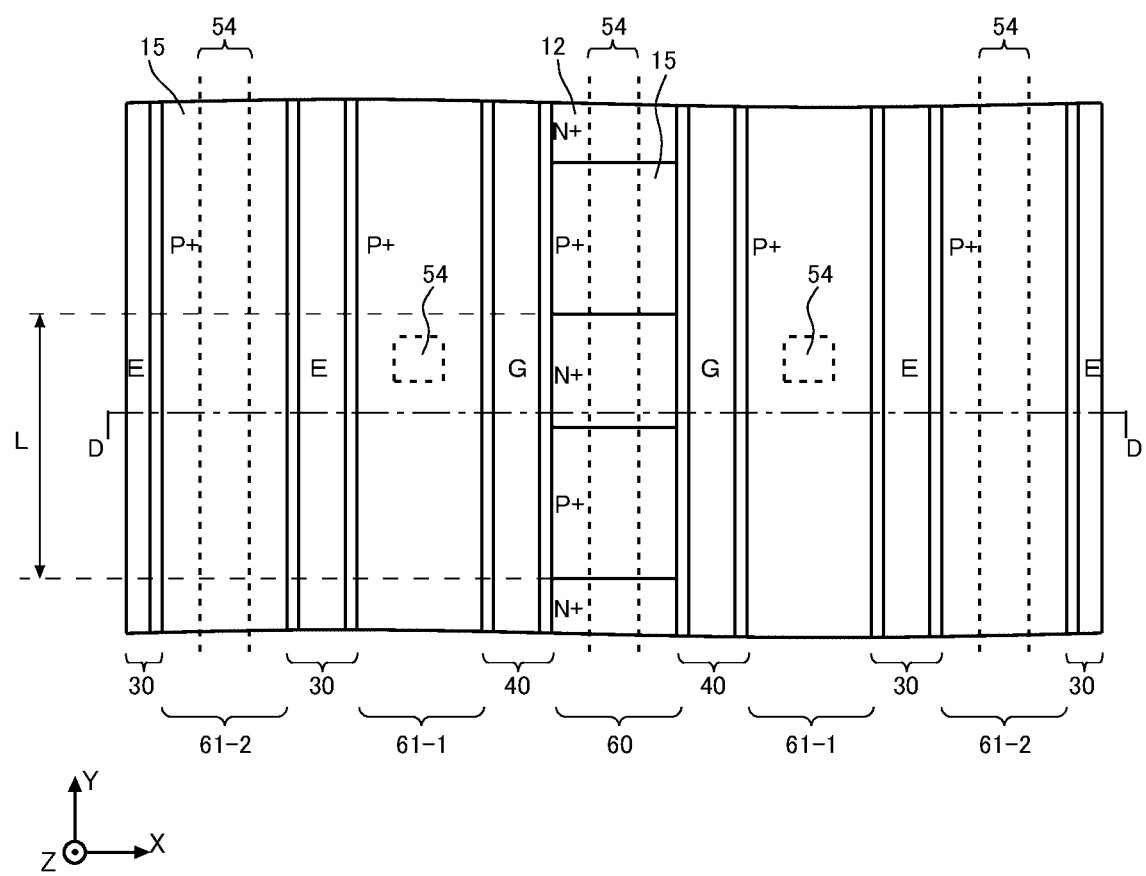
FIG. 9 illustrates an arrangement example of contact holes 54 of the dummy mesa portions 61 in the top view.

FIG. 9 illustrates an arrangement example of the contact holes 54 of the dummy mesa portions 61 in the top view. FIG. 9 illustrates a top view of the active mesa portion 60, the dummy mesa portion 61, the gate trench portion 40, and the dummy trench portion 30 illustrated in FIG. 8. FIG. 9 illustrates a partial range of these configurations in the Y axis direction. FIG. 8 illustrates a cross section taken along line D-D in FIG. 9. In FIG. 9, hatching the gate conductive portion 44 and the dummy conductive portion 34 with diagonal lines is omitted.

The configuration other than the upper surface of the dummy mesa portion 61 is similar to that of the example illustrated in FIG. 3, FIG. 5, or FIG. 7. As described above, the resistance film 210 may or may not be provided in the dummy mesa portion 61. The trench contact 220 may or may not be provided in the active mesa portion 60. On the upper surface of the dummy mesa portion 61, the contact region 15 may be exposed, or the P type region having a lower doping concentration than the contact region 15 may be exposed.

The area of the contact hole 54 (second contact hole) of a dummy mesa portion 61-1 adjacent to the active mesa portion 60 in the X axis direction is smaller than the area of the contact hole 54 (first contact hole) of the active mesa portion 60. In the dummy mesa portion 61-1, the contact holes 54 may be discretely arranged in the Y axis direction. The total area of the contact hole 54 in one dummy mesa portion 61-1 may be 1/1000 or less, 1/5000 or less, 1/30000 or less, or 1/50000 or less of the total area of the contact hole 54 in one active mesa portion 60. The total area of the contact hole 54 in one dummy mesa portion 61-1 may be 1/100000 or more, 1/90000 or more, or 1/80000 or more of the total area of the contact hole 54 in one active mesa portion 60.

A dummy mesa portion 61-2 not adjacent to the active mesa portion 60 in the X axis direction may have a configuration similar to or different from the dummy mesa portion 61-1. The area of the contact hole 54 in the dummy mesa portion 61-2 of this example is larger than the area of the contact hole in the dummy mesa portion 61-1. The area of the contact hole 54 of the dummy mesa portion 61-2 may be the same as or smaller than the area of the contact hole 54 of the active mesa portion 60. The area of the contact hole of the dummy mesa portion 61 may increase as a distance from the active mesa portion 60 increases.

Figure 10:
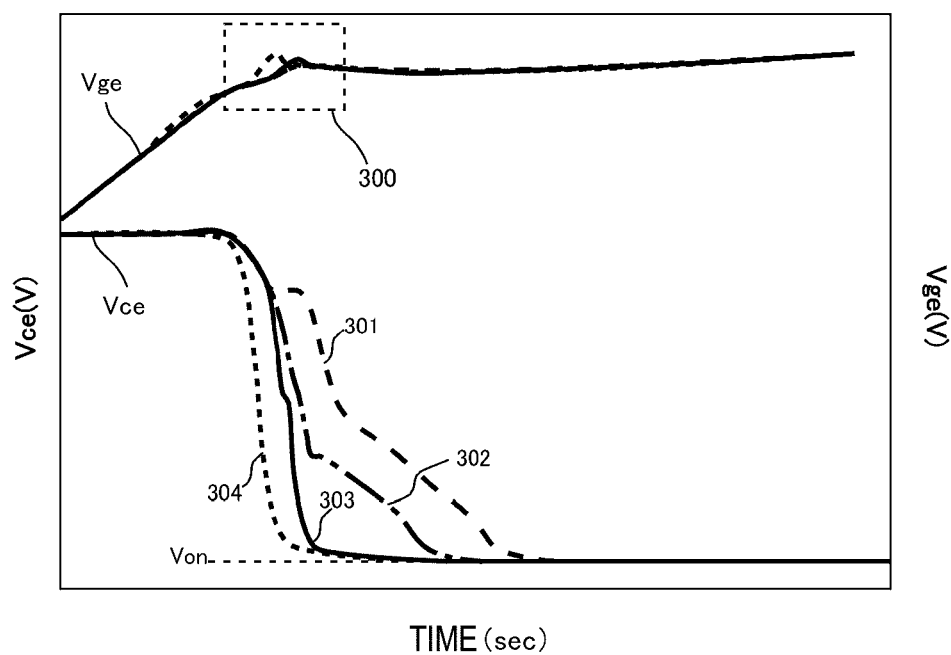

FIG. 10 illustrates an example of time waveforms of a collector-emitter voltage Vce and a gate voltage Vge of the semiconductor device 100 at the time of turn-on. FIG. 10 illustrates each waveform for each contact resistance ratio R2/R1 of the dummy mesa portion 61 and the active mesa portion 60.

When the semiconductor device 100 is turned on, the collector-emitter voltage Vce decreases to a predetermined on-voltage Von. In the collector-emitter voltage Vce, a waveform 301 is an example in which the contact resistance ratio is 1 (that is, R1=R2), a waveform 302 is an example in which the contact resistance ratio is 30000 (that is, R2 is 30000 times R1), a waveform 303 is an example in which the contact resistance ratio is 50000, and a waveform 304 is an example in which the contact resistance ratio is infinite (that is, the dummy mesa portion 61 is floating with respect to the emitter electrode 52).

Figure 11:
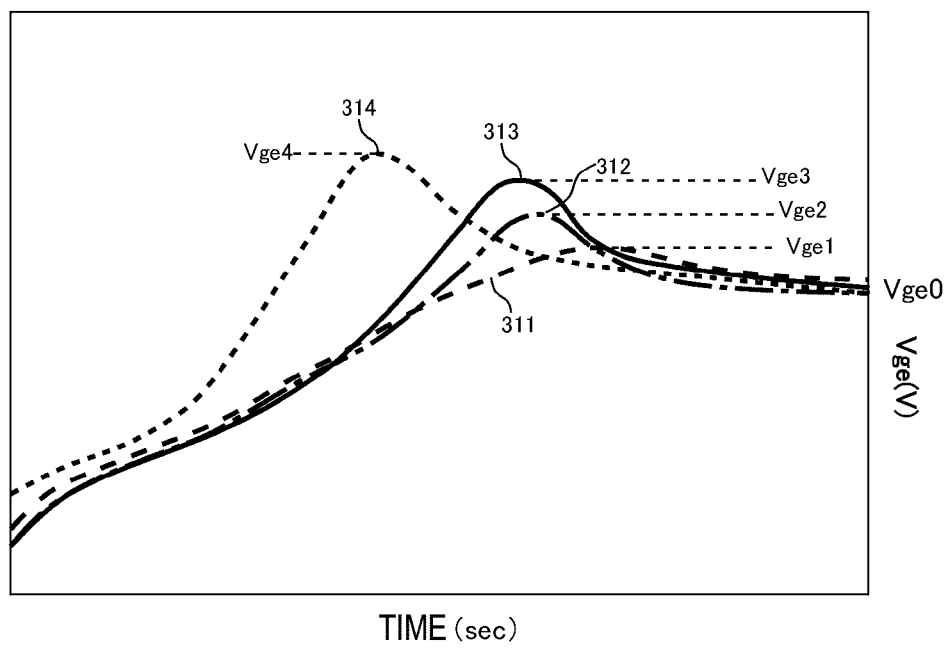
FIG. 11 illustrates an enlarged view of a gate voltage waveform of a region 300 illustrated in FIG. 10.

FIG. 11 illustrates an enlarged view of a gate voltage waveform of a region 300 illustrated in FIG. 10. In the gate voltage Vge, a waveform 311 is an example in which the contact resistance ratio is 1, a waveform 312 is an example in which the contact resistance ratio is 30000, a waveform 313 is an example in which the contact resistance ratio is 50000, and a waveform 314 is an example in which the contact resistance ratio is infinite. Note that in FIGS. 10 and 11, the collector current is a rated current (210A in this example), and a large current flows through the semiconductor device 100.

As illustrated in FIG. 11, peak values Vge1, Vge2, Vge3, and Vge4 of the gate voltage increase as the contact resistance ratio increases. As described in FIG. 2, it is considered that the displacement current flows into the gate trench portion 40 by increasing the dummy contact resistance R2, and the peak value Vge of the gate voltage rises. In the present specification, each difference (Vge4-Vge0, Vge3-Vge0, Vge2-Vge0, Vge1-Vge0) of the peak values Vge1, Vge2, Vge3, and Vge4 with respect to a steady-state gate voltage Vge0 after turn-on may be referred to as a rising amount of the gate voltage Vge.

As illustrated in FIG. 10, a time until the collector-emitter voltage Vce converges to the on-voltage Von is shortened when the peak value of the gate voltage Vge rises. Thus, the switching loss at the time of turn-on can be reduced. On the other hand, when the collector current is a small current (for example, 10% or less of the rated current), the displacement current is small, so that the rising amount of the gate voltage Vge is considerably small. Thus, the switching time at the time of small current drive is not shortened, and radiated noise or the like can be suppressed.

Figure 12:
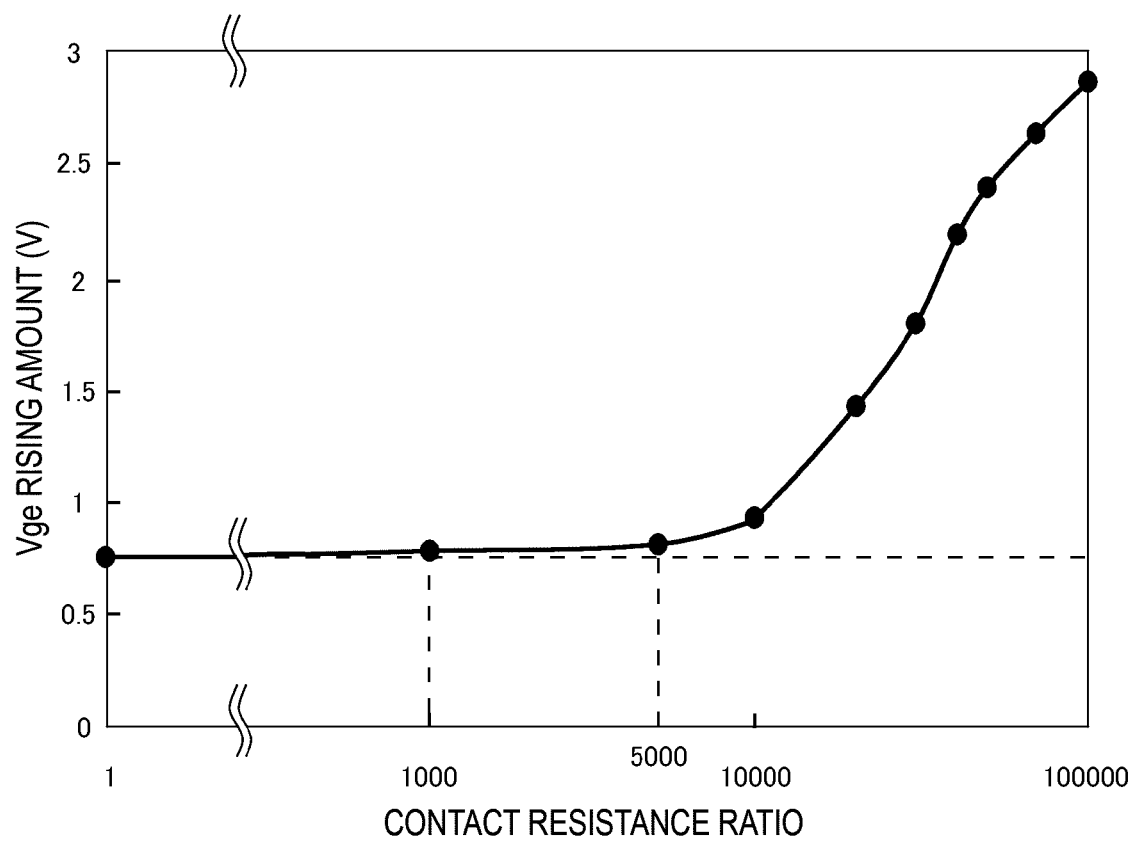
FIG. 12 illustrates a relationship between a contact resistance ratio R2/R1 and a rising amount of the gate voltage Vge.
loss.

FIG. 12 illustrates a relationship between the contact resistance ratio R2/R1 and the rising amount of the gate voltage Vge. As described above, the rising amount of the gate voltage Vge can be increased by increasing the contact resistance ratio R2/R1. A case where the contact resistance ratio R2/R1 is 1 is a comparative example in which the active contact resistance R1 is equal to the dummy contact resistance R2. When the contact resistance ratio R2/R1 is less than 1000, the rising amount of the gate voltage Vge is about 0.8V, and does not change as compared with a case where the contact resistance ratio R2/R1 is 1. However, when the contact resistance ratio R2/R1 is 1000 or more, the rising amount of the gate voltage Vge increases as compared with a case where the contact resistance ratio R2/R1 is 1. That is, the contact resistance ratio R2/R1 is preferably 1000 or more.

When the contact resistance ratio R2/R1 becomes 5000, the increase in the rising amount of the gate voltage Vge increases. The contact resistance ratio R2/R1 may be 5000 or more. When the contact resistance ratio R2/R1 becomes 10000, the rise of the gate voltage Vge becomes more remarkable. The contact resistance ratio R2/R1 may be 10000 or more. The contact resistance ratio R2/R1 may be 30000 or more, or 50000 or more.

Figure 13:
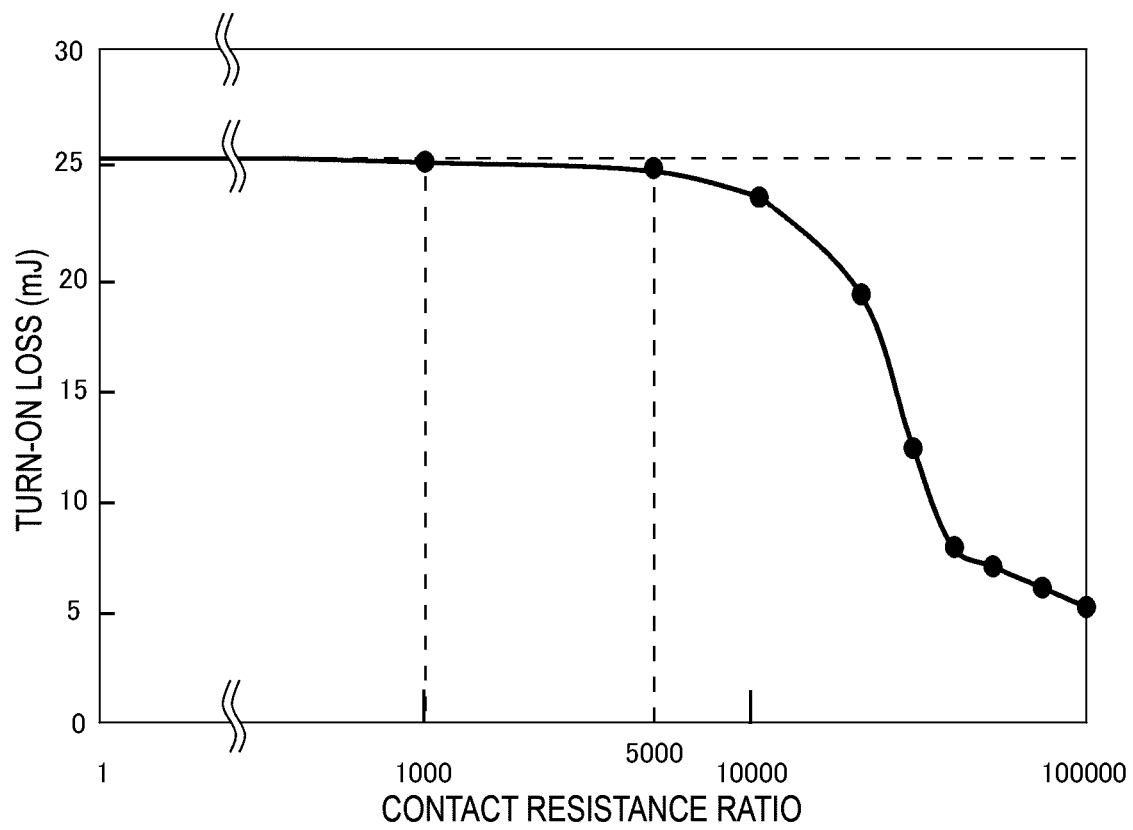
FIG. 13 illustrates a relationship between a contact resistance ratio R2/R1 and a turn-on loss.

FIG. 13 illustrates a relationship between the contact resistance ratio R2/R1 and the turn-on loss. A case where the contact resistance ratio R2/R1 is 1 is a comparative example in which the active contact resistance R1 is equal to the dummy contact resistance R2. When the contact resistance ratio R2/R1 is less than 1000, the turn-on loss is 25 (mJ), which is not changed as compared with a case where the contact resistance ratio R2/R1 is 1. However, when the contact resistance ratio R2/R1 is 1000 or more, the turn-on loss decreases as compared with a case where the contact resistance ratio R2/R1 is 1. That is, the contact resistance ratio R2/R1 is preferably 1000 or more. When the contact resistance ratio R2/R1 becomes 5000, the decrease amount of the turn-on loss increases. When the contact resistance ratio R2/R1 becomes 10000, the decrease in the turn-on loss becomes more remarkable.

Figure 14:
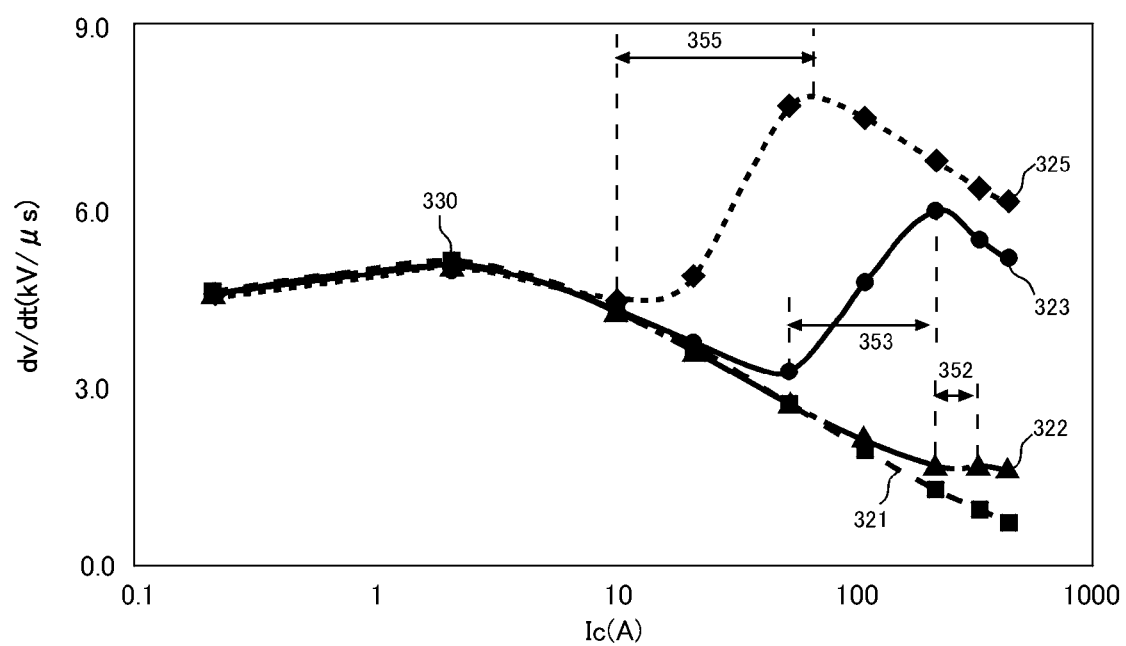

FIG. 14 illustrates an example of a current (Ic)-voltage change rate (dv/dt) characteristic at the time of turn-on. The current Ic is a collector current of the semiconductor device 100. The voltage change rate is a voltage change amount per unit time obtained by differentiating the waveform of the collector-emitter voltage Vce with time. Alternatively, the voltage change rate may be a value when the absolute value of the voltage change rate is maximized while the collector-emitter voltage Vce decreases to the on-voltage Von, or may be a gradient of the waveform between two points of 90% to 10% of the maximum value of the collector-emitter voltage Vce. A waveform 321 is an example in which the contact resistance ratio is 1, a waveform 322 is an example in which the contact resistance ratio is 30000, a waveform 323 is an example in which the contact resistance ratio is 50000, and a waveform 325 is an example in which the contact resistance ratio is 80000. In this example, the rated current of the semiconductor device 100 is indicated by Ir. The rated current Ir in FIG. 14 is 210A, but is not limited thereto.

As shown in each waveform, the current-voltage change rate characteristic has a peak portion 330 in which the voltage change rate dv/dt exhibits a local maximum value in a small current region (for example, a region where the collector current Ic is less than Ir×5%). As shown in the waveform 321, in a case where the contact resistance ratio R2/R1 is 1, when the collector current Ic is increased more than that of the peak portion 330, the voltage change rate dv/dt monotonically decreases. Thus, in a large current region (for example, a region where the collector current Ic is Ir×5% or more and Ir or less), the turn-on time becomes long, and the turn-on loss increases.

On the other hand, as shown in the waveform 322, the waveform 323, and the waveform 325, when the contact resistance ratio R2/R1 is increased, the voltage change rate dv/dt is maintained or increased in a part of the current region in a direction in which the collector current Ic is increased from the peak portion 330. The waveform 322 has a maintaining and increasing region 352 in which the voltage change rate dv/dt is maintained or slightly increased. The waveform 323 has a maintaining and increasing region 353 in which the voltage change rate dv/dt greatly increases, and the waveform 325 has a maintaining and increasing region 355 in which the voltage change rate dv/dt greatly increases. Since the current-voltage change rate characteristic has the maintaining and increasing region on the larger current side than the peak portion 330, the turn-on speed is remarkably shortened, and the turn-on loss is remarkably reduced.

Figure 15:
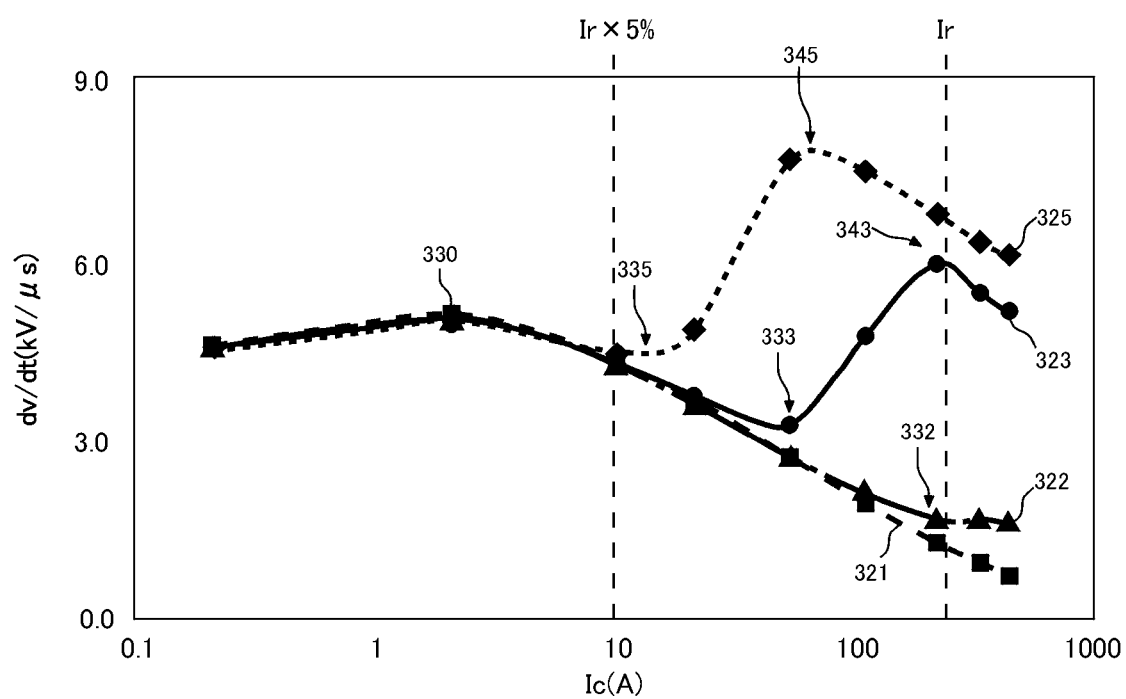

FIG. 15 illustrates an example of the current (Ic)-voltage change rate (dv/dt) characteristic at the time of turn-on. Each waveform in FIG. 15 is the same as each waveform illustrated in FIG. 14. In the current-voltage change rate characteristic, the voltage change rate dv/dt when the collector current is the rated current Ir may be larger than the voltage change rate dv/dt when the collector current is 5% of the rated current Ir. In the example of FIG. 15, in the waveform 323 and the waveform 325, dv/dt when Ic=Ir is larger than dv/dt when Ic=Ir×5%. As a result, the turn-on speed is further shortened, and the turn-on loss is remarkably reduced. dv/dt when Ic=Ir may be 1.1 times or more, 1.2 times or more, or 1.5 times or more dv/dt when Ic=Ir×5%.

In the current-voltage change rate characteristic, it is preferable that the voltage change rate dv/dt exhibits a local maximum value in a large current region (for example, a region where the collector current Ic is Ir×5% or more and Ir or less). The waveform 325 has a peak portion 345 exhibiting a local maximum value in the large current region, and the waveform 323 has a peak portion 343 in the large current region. The voltage change rate dv/dt at the peak portions 345 and 343 in the large current region is preferably larger than the voltage change rate dv/dt at the peak portion 330 in the small current region. The voltage change rate dv/dt at the peak portions 345 and 343 may be 1.1 times or more, 1.2 times or more, or 1.5 times or more the voltage change rate dv/dt at the peak portion 330 in the small current region.

In the current-voltage change rate characteristic, the voltage change rate dv/dt may exhibit a local minimum value in the large current region. The waveform 325 has a valley portion 335 exhibiting a local minimum value, the waveform 323 has a valley portion 333, and the waveform 322 has a valley portion 332.

Figure 16:
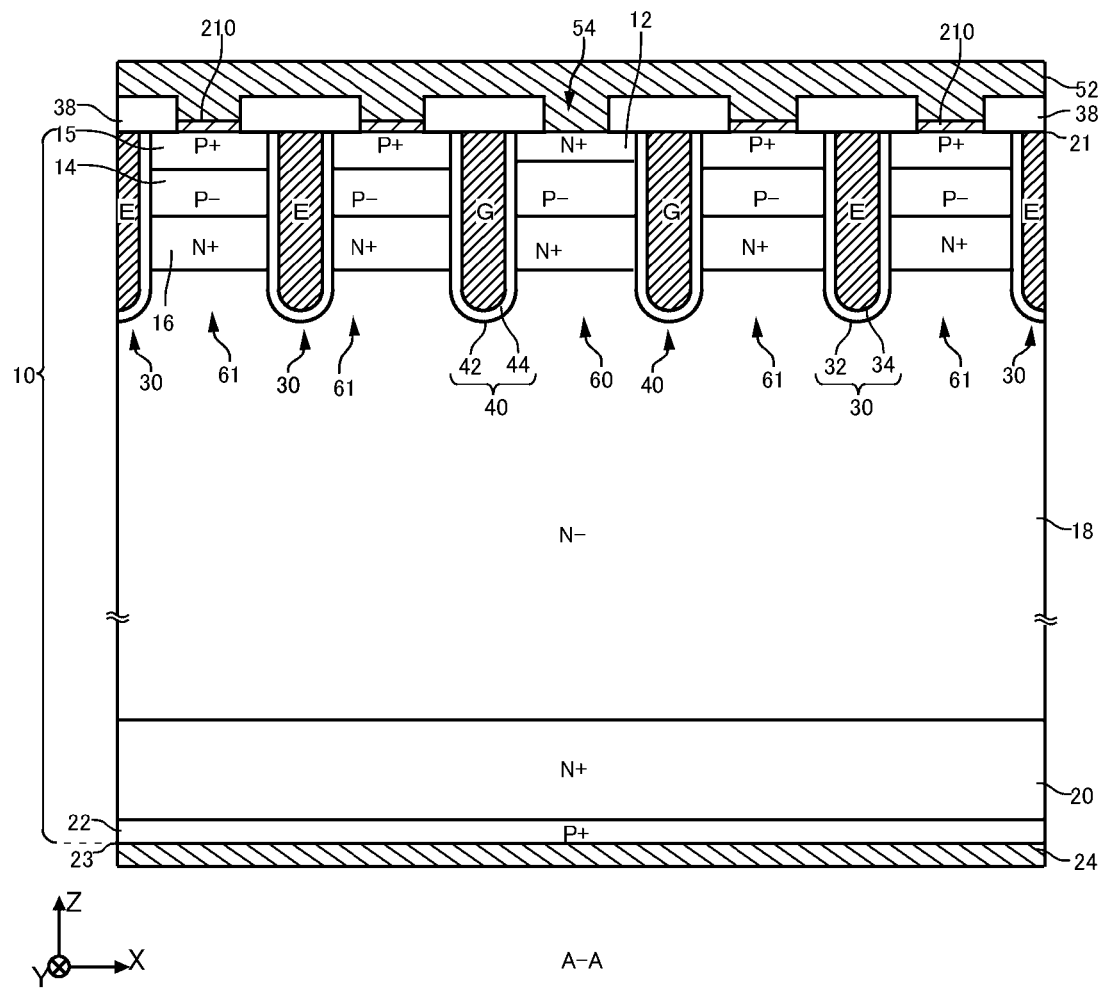
FIG. 16 illustrates another example of a cross section of the semiconductor device 100.

FIG. 16 illustrates another example of the cross section of the semiconductor device 100. The semiconductor device 100 of this example has an accumulation region 16. Other structures are similar to those of any of the aspects described in FIGS. 1 to 15. FIG. 16 illustrates a structure in which the accumulation region 16 is added to the structure of the A-A cross section illustrated in FIG. 2, but the structures other than the accumulation region 16 are not limited to the structures of the A-A cross section.

The accumulation region 16 is provided below the base region 14 in each mesa portion. The accumulation region 16 is an N+ type region with a higher doping concentration than the drift region 18. By providing the accumulation region 16 having the high concentration between the drift region 18 and the base region 14, it is possible to improve a carrier injection enhancement effect (IE effect) and reduce an on-voltage.

The active mesa portion 60 and the dummy mesa portion 61 may be provided with accumulation regions 16 having the same doping concentration. In another example, the integrated concentration obtained by integrating the doping concentration of the accumulation region 16 of the dummy mesa portion 61 in the depth direction may be larger than the integrated concentration obtained by integrating the doping concentration of the accumulation region 16 of the active mesa portion 60 in the depth direction. For example, the accumulation region 16 of the dummy mesa portion 61 may have a larger peak value of the doping concentration than the accumulation region 16 of the active mesa portion 60. In addition, the accumulation region 16 of the dummy mesa portion 61 may have a larger number of doping concentration peaks in the depth direction than the accumulation region 16 of the active mesa portion 60. By increasing the integrated concentration of the accumulation region 16 of the dummy mesa portion 61, the holes are easily accumulated below the dummy mesa portion 61, and a displacement current easily flows through the gate trench portion 40. Thus, the turn-on time can be further shortened. The integrated concentration of the accumulation region 16 of the dummy mesa portion 61 may be 2 times or more, 5 times or more, or 10 times or more the integrated concentration of the accumulation region 16 of the active mesa portion 60.

Figure 17:
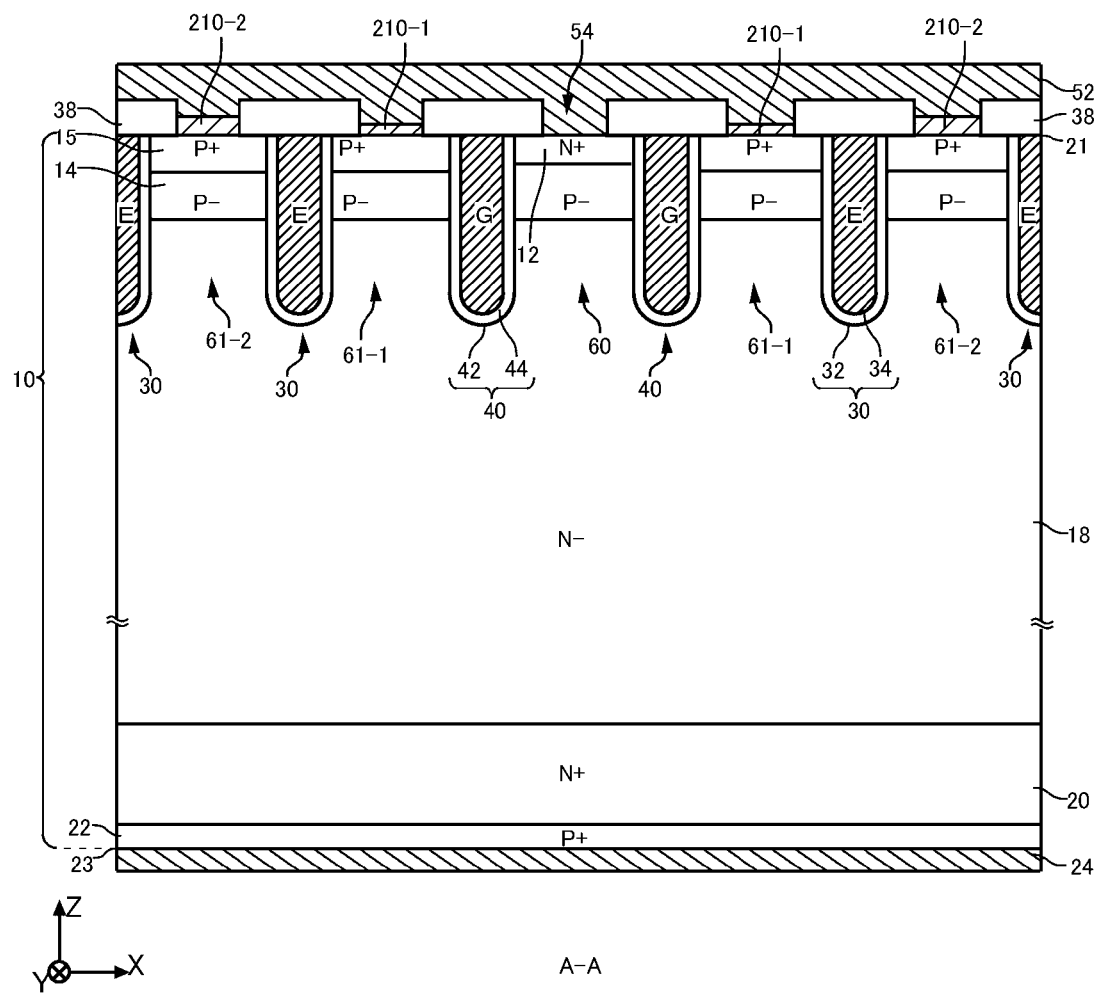
FIG. 17 illustrates another example of the cross section of the semiconductor device 100.

FIG. 17 illustrates another example of the cross section of the semiconductor device 100. The semiconductor device 100 of this example includes a first dummy mesa portion 61-1 and a second dummy mesa portion 61-2 having contact resistances R2 different from each other. The structures of the dummy mesa portion 61 other than the contact resistance R2 are similar to those of any of the aspects described in FIGS. 1 to 16.

Both the first dummy mesa portion 61-1 and the second dummy mesa portion 61-2 are in contact with the dummy trench portion 30. The first dummy mesa portion 61-1 is the dummy mesa portion 61 on the gate trench portion 40 side in the dummy mesa portions 61 in contact with the dummy trench portion 30. The second dummy mesa portion 61-2 is the dummy mesa portion 61 on the opposite side of the gate trench portion 40 (or the first dummy mesa portion 61-1).

The dummy contact resistance of the first dummy mesa portion 61-1 of this example is lower than the dummy contact resistance of the second dummy mesa portion 61-2. In the example of FIG. 17, a first resistance film 210-1 is provided in the first dummy mesa portion 61-1, and a second resistance film 210-2 is provided in the second dummy mesa portion 61-2. The film thickness of the second resistance film 210-2 may be larger than the film thickness of the first resistance film 210-1. In another example, respective dummy contact resistances may be adjusted by making the doping concentration of the upper surface of the dummy mesa portion 61 or the area of the contact hole 54 for exposing the upper surface of the dummy mesa portion 61 different between the first dummy mesa portion 61-1 and the second dummy mesa portion 61-2.

In the active mesa portion 60, the hole below the emitter region 12 bypasses the emitter region 12 and flows to the contact region 15. Thus, in the active mesa portion 60, the moving distance of the hole increases, and latch-up may occur. By making the dummy contact resistance of the first dummy mesa portion 61-1 close to the active mesa portion 60 relatively small, the hole below the active mesa portion 60 easily flows to the first dummy mesa portion 61-1. Thus, the hole current flowing through the active mesa portion 60 can be reduced to suppress latch-up. The dummy contact resistance of the first dummy mesa portion 61-1 may be half or less, 25% or less, or 10% or less of the dummy contact resistance of the second dummy mesa portion 61-2. However, the dummy contact resistances of the first dummy mesa portion 61-1 and the second dummy mesa portion 61-2 both satisfy the condition of the dummy contact resistance of the dummy mesa portion 61 described in FIGS. 1 to 16.

Figure 18:
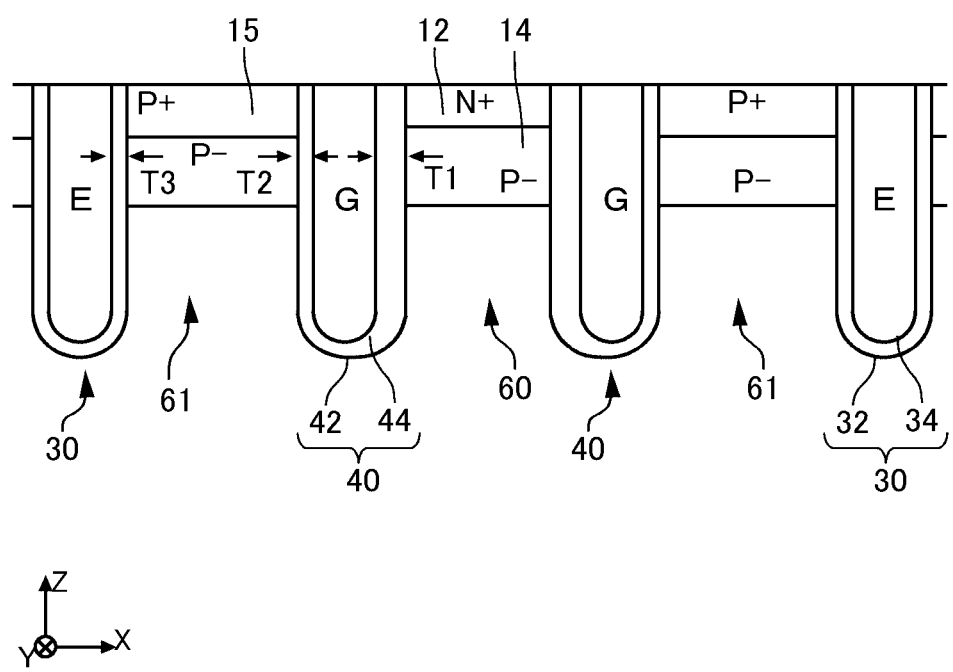
FIG. 18 illustrates another structure example of a gate trench portion 40.

FIG. 18 illustrates another structure example of the gate trench portion 40. The structures other than the gate trench portion 40 is similar to those of any of the aspects described in FIGS. 1 to 17. In FIG. 18, the vicinity of the gate trench portion 40 is enlarged. Further, hatching the gate conductive portion 44 and the dummy conductive portion 34 with diagonal lines is omitted.

In the gate trench portion 40 of this example, a thickness T2 of the gate dielectric film 42 in contact with the dummy mesa portion 61 is smaller than a thickness T1 of the gate dielectric film 42 in contact with the active mesa portion 60. The thickness of the gate dielectric film 42 may be a thickness in the X axis direction. As the thickness of the gate dielectric film 42, an average film thickness of a portion in contact with the base region 14 may be used. By thinning the gate dielectric film 42 on the dummy mesa portion 61 side, a displacement current easily flows from the dummy mesa portion 61 to the gate conductive portion 44. As a result, the turn-on time can be shortened, and the turn-on loss can be further reduced. According to the configuration of this example, the turn-on loss can be reduced even when the contact resistance ratio R2/R1 is relatively small. The thickness T2 may be 75% or less or 50% or less of the thickness T1. For example, after the entire inner wall of the gate trench is oxidized to form a dielectric film, the dielectric film on the dummy mesa portion 61 side is selectively removed, and the entire inner wall of the gate trench is further oxidized, so that the gate dielectric film 42 having a partially different thickness can be formed.

Further, the thickness of the dummy dielectric film 32 of the dummy trench portion 30 is defined as T3. The thickness T2 may be the same as the thickness T3. The thickness T2 may be smaller than the thickness T3. Further, the thicknesses T2 and T1 of the gate dielectric film 42 may be the same, and the thickness T3 of the dummy dielectric film 32 may be smaller than the thickness T2.

Figure 19:
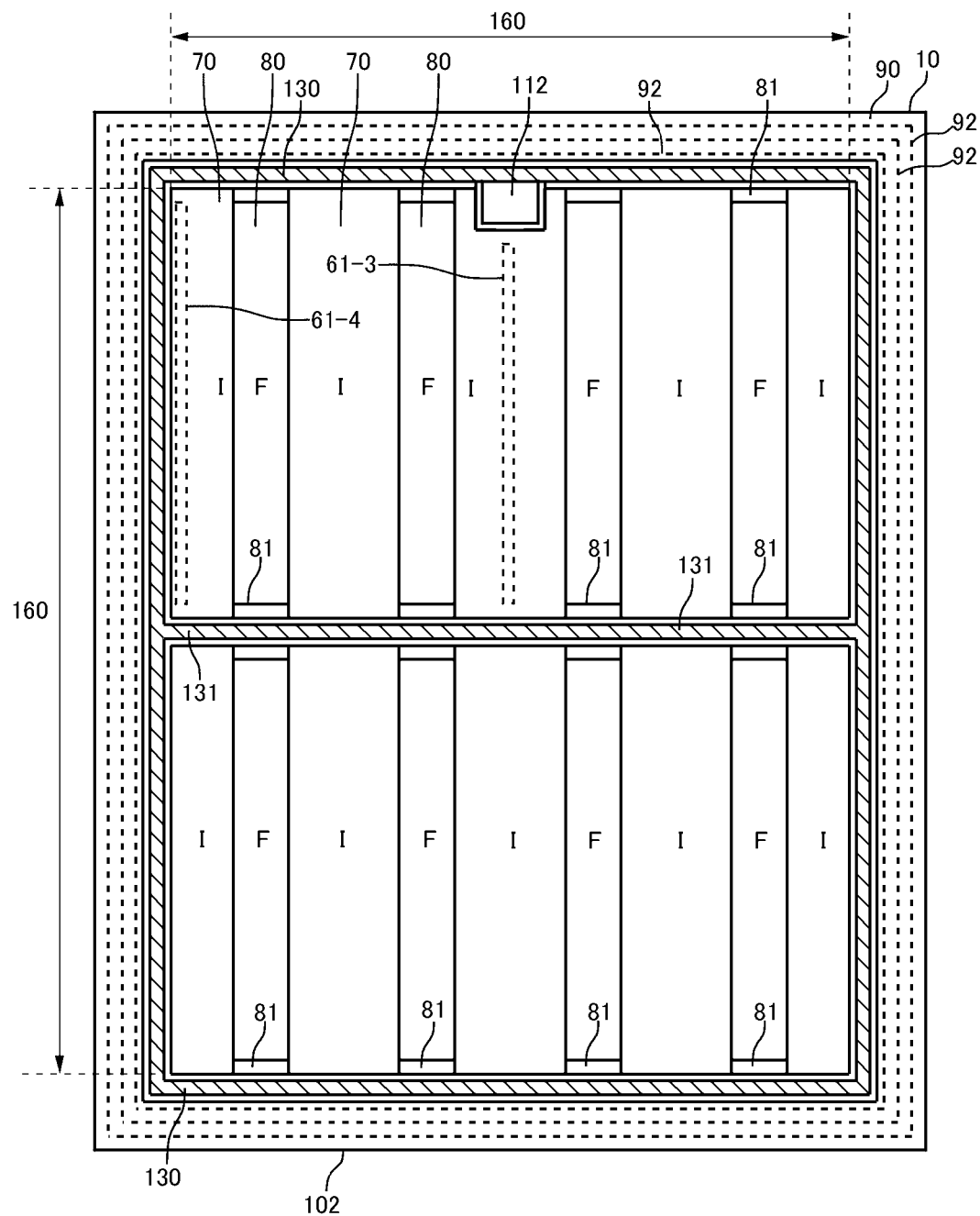
FIG. 19 illustrates a part of the dummy mesa portions 61 in the top view of the semiconductor device 100.

FIG. 19 illustrates a part of the dummy mesa portion 61 in the top view of the semiconductor device 100. In FIG. 19, among a plurality of dummy mesa portions 61, a third dummy mesa portion 61-3 and a fourth dummy mesa portion 61-4 are illustrated. In FIG. 19, illustrations of other dummy mesa portions 61 are omitted. The structures of the third dummy mesa portion 61-3 and the fourth dummy mesa portion 61-4 are similar to those of the dummy mesa portion 61 described in FIGS. 1 to 18.

The fourth dummy mesa portion 61-4 is arranged closer to the end portion (the end side 102 in this example) of the semiconductor substrate 10 than the third dummy mesa portion 61-3. As an example, the third dummy mesa portion 61-3 is the dummy mesa portion 61 at the center in the X axis direction among the plurality of dummy mesa portions 61. As an example, the fourth dummy mesa portion 61-4 is the outermost dummy mesa portion 61 in the X axis direction among the plurality of dummy mesa portions 61.

The dummy contact resistance of the fourth dummy mesa portion 61-4 may be the same as or lower than the dummy contact resistance of the third dummy mesa portion 61-3. In the vicinity of the end portion of the semiconductor substrate 10, the hole from the edge termination structure portion 90 easily flows through the active mesa portion 60, so that latch-up is likely to occur. By making the dummy contact resistance of the fourth dummy mesa portion 61-4 relatively low, the hole from the edge termination structure portion 90 can be easily withdrawn by the fourth dummy mesa portion 61-4, and latch-up in the active mesa portion 60 can be suppressed. The dummy contact resistance of the third dummy mesa portion 61-3 may be 1.2 times or more, 1.5 times or more, or 2 times or more the dummy contact resistance of the fourth dummy mesa portion 61-4. As the dummy mesa portion 61 is closer to the end portion of the semiconductor substrate 10 in the X axis direction, the dummy contact resistance may be smaller. Further, the dummy contact resistance of the dummy mesa portion 61 closest to the end portion of the semiconductor substrate 10 may be the minimum value among the dummy contact resistances of all the dummy mesa portions 61.

Figure 20:
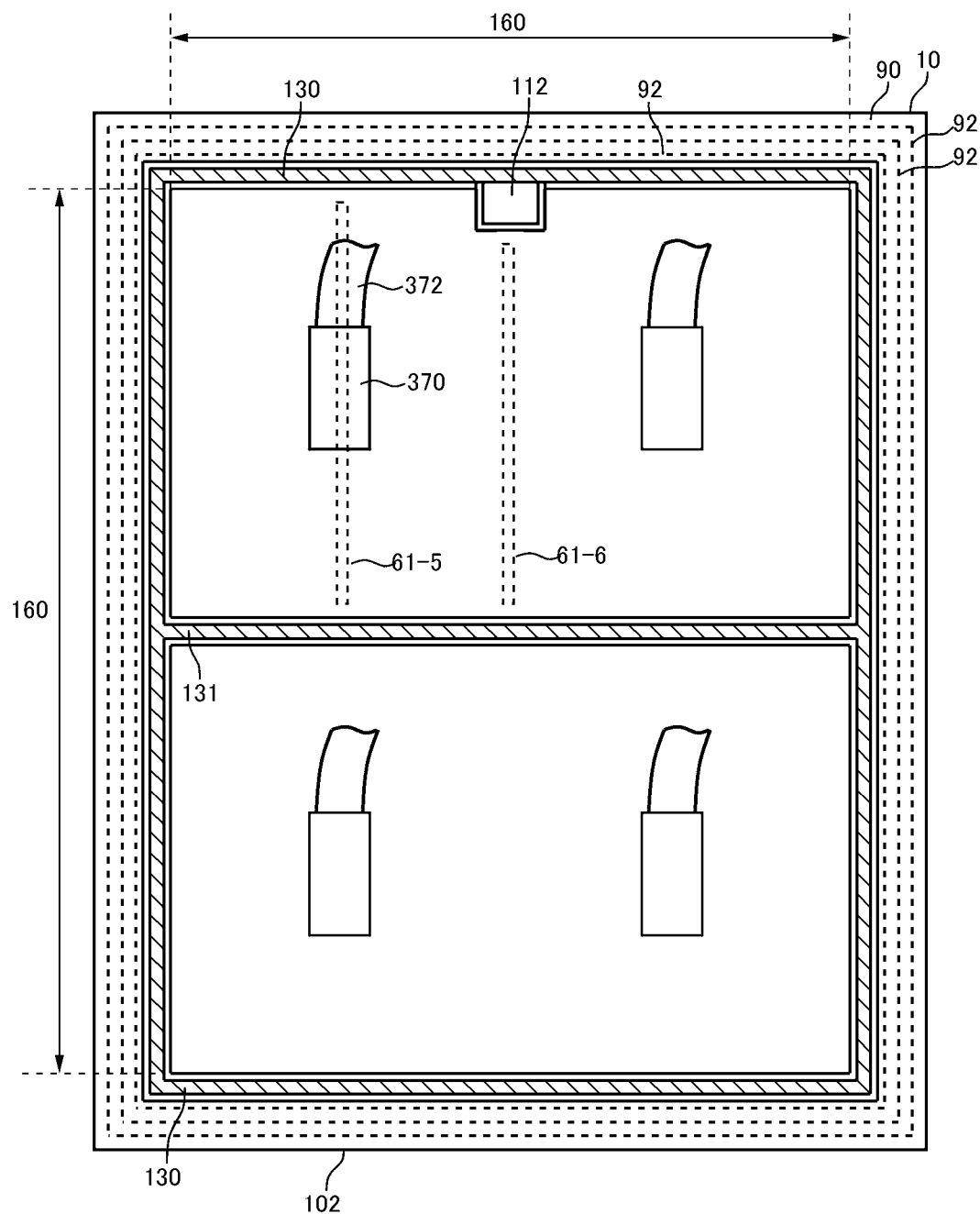
FIG. 20 illustrates a part of the dummy mesa portions 61 in the top view of the semiconductor device 100.

FIG. 20 illustrates a part of the dummy mesa portion 61 in the top view of the semiconductor device 100. In FIG. 20, illustrations of the transistor portion 70 and the diode portion 80 in the active portion 160 are omitted. The semiconductor device 100 of this example has a wiring 372 connected to a connection region 370 on the upper surface of the emitter electrode 52. The wiring 372 may be a linear wire, a plate-shaped lead frame, or a rod-shaped pin. When the wiring 372 is fixed with a conductive member such as solder, the conductive member is also included in the wiring 372. The connection region 370 is a region where the upper surface of the emitter electrode 52 and the wiring 372 are in contact with each other.

In FIG. 20, among the plurality of dummy mesa portions 61, a fifth dummy mesa portion 61-5 and a sixth dummy mesa portion 61-6 are illustrated. In FIG. 20, illustrations of other dummy mesa portions 61 are omitted. The structures of the fifth dummy mesa portion 61-5 and the sixth dummy mesa portion 61-6 are similar to those of the dummy mesa portion 61 described in FIGS. 1 to 18.

The fifth dummy mesa portion 61-5 overlaps with any of the connection regions 370 in the top view. A part of the fifth dummy mesa portion 61-5 may overlap with the connection region 370, or the entire dummy mesa portion 61-5 may overlap with the connection region 370. The sixth dummy mesa portion 61-6 does not overlap with any connection region 370 in the top view.

The dummy contact resistance of the fifth dummy mesa portion 61-5 may be the same as or lower than the dummy contact resistance of the sixth dummy mesa portion 61-6. In a region overlapping with the connection region 370, a large collector current may flow, and latch-up is likely to occur. By making the dummy contact resistance of the fifth dummy mesa portion 61-5 relatively low, the hole can be easily withdrawn by the fifth dummy mesa portion 61-5, and latch-up in the active mesa portion 60 can be suppressed. The dummy contact resistance of the sixth dummy mesa portion 61-6 may be 1.2 times or more, 1.5 times or more, or 2 times or more the dummy contact resistance of the fifth dummy mesa portion 61-5. As the dummy mesa portion 61 is closer to the connection region 370 in the X axis direction, the dummy contact resistance may be smaller. Further, the dummy contact resistance of the fifth dummy mesa portion 61-5 may be the minimum value in the dummy contact resistances of all the dummy mesa portions 61.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor substrate having an upper surface and a lower surface and provided with a drift region of a first conductivity type;
   an emitter electrode provided above the upper surface of the semiconductor substrate;
   a plurality of trench portions provided on the upper surface of the semiconductor substrate and arranged spaced from each other in an array direction; and
   a plurality of mesa portions sandwiched between each of the plurality of trench portions inside the semiconductor substrate, wherein
   the plurality of trench portions include a gate trench portion to which a gate voltage is applied,
   one mesa portion of two mesa portions in contact with the gate trench portion among the plurality of mesa portions is an active mesa portion in which an emitter region of the first conductivity type having a doping concentration higher than that of the drift region is arranged in contact with the gate trench portion,
   an other mesa portion of the two mesa portions in contact with the gate trench portion is a dummy mesa portion not having the emitter region, and
   a dummy contact resistance which is a resistance of the dummy mesa portion and the emitter electrode is 1000 times or more as high as an active contact resistance which is a resistance of the active mesa portion and the emitter electrode.

2. The semiconductor device according to claim 1, wherein the dummy contact resistance is 5000 times or more as high as the active contact resistance.

3. The semiconductor device according to claim 1, wherein the dummy contact resistance is 30000 times or more as high as the active contact resistance.

4. The semiconductor device according to claim 1, wherein the dummy contact resistance is 50000 times or more as high as the active contact resistance.

5. The semiconductor device according to claim 1, wherein the dummy contact resistance is 100000 times or less as high as the active contact resistance.

6. The semiconductor device according to claim 1, further comprising a resistance film provided between the dummy mesa portion and the emitter electrode and formed of a material having a volume resistivity higher than that of the emitter electrode.

7. The semiconductor device according to claim 1, wherein
   The dummy mesa portion has a region of a second conductivity type exposed on the upper surface of the semiconductor substrate, and
   the active mesa portion has a contact region of the second conductivity type having a doping concentration higher than that of the region of the second conductivity type of the dummy mesa portion.

8. The semiconductor device according to claim 7, wherein
   the active mesa portion has a base region of the second conductivity type provided between the drift region and the emitter region, and
   a doping concentration of the region of the second conductivity type of the dummy mesa portion is not more than that of the base region.

9. The semiconductor device according to claim 1, further comprising an interlayer dielectric film provided between the upper surface of the semiconductor substrate and the emitter electrode, wherein
   the interlayer dielectric film is provided with a first contact hole configured to connect the emitter electrode and the active mesa portion and a second contact hole configured to connect the emitter electrode and the dummy mesa portion, and
   in a top view, a total area of the second contact hole for one of the dummy mesa portions is smaller than a total area of the first contact hole for one of the active mesa portions.

10. The semiconductor device according to claim 1, wherein
    the active mesa portion has a trench contact provided from the upper surface of the semiconductor substrate into the semiconductor substrate and connected to the emitter electrode, and
    the trench contact is not provided in the dummy mesa portion.

11. The semiconductor device according to claim 1, wherein
    the active mesa portion has a base region of a second conductivity type provided between the drift region and the emitter region,
    the dummy mesa portion has the base region between the drift region and the upper surface of the semiconductor substrate, the active mesa portion and the dummy mesa portion have an accumulation region of the first conductivity type having a doping concentration higher than that of the drift region between the base region and the drift region, and an integrated concentration obtained by integrating the doping concentration of the accumulation region of the dummy mesa portion in a depth direction is larger than an integrated concentration obtained by integrating the doping concentration of the accumulation region of the active mesa portion in the depth direction.

12. The semiconductor device according to claim 1, wherein
the gate trench portion includes a gate conductive portion and a gate dielectric film provided between the gate conductive portion and the semiconductor substrate, and
the gate dielectric film in contact with the dummy mesa portion is thinner than the gate dielectric film in contact with the active mesa portion.

13. The semiconductor device according to claim 1, wherein
the plurality of trench portions include a dummy trench portion which is arranged adjacent to the gate trench portion with the dummy mesa portion sandwiched therebetween in the array direction and is applied with a voltage different from the gate voltage,
among the mesa portions in contact with the dummy trench portion, the mesa portion on a side of the gate trench portion is a first one of the dummy mesa portions not having the emitter region, and the mesa portion on a side opposite to the gate trench portion is a second one of the dummy mesa portions not having the emitter region, and
the dummy contact resistance of the first one of the dummy mesa portions is lower than the dummy contact resistance of the second one of the dummy mesa portions.

14. The semiconductor device according to claim 1, wherein
the plurality of mesa portions has a third one of the dummy mesa portions not having the emitter region, and a fourth one of the dummy mesa portions arranged closer to an end portion of the semiconductor substrate than the third one of the dummy mesa portions in the array direction and not having the emitter region, and
the dummy contact resistance of the fourth one of the dummy mesa portions is lower than the dummy contact resistance of the third one of the dummy mesa portions.

15. The semiconductor device according to claim 1, further comprising a wiring connected to a connection region on an upper surface of the emitter electrode, wherein
the plurality of mesa portions include a fifth one of the dummy mesa portions overlapping with the connection region in a top view and not having the emitter region, and a sixth one of the dummy mesa portions not overlapping with the connection region in the top view and not having the emitter region, and
the dummy contact resistance of the fifth one of the dummy mesa portions is lower than the dummy contact resistance of the sixth one of the dummy mesa portions.

16. The semiconductor device according to claim 1, wherein
a current-voltage change rate characteristic indicating a relationship between a collector current flowing through the semiconductor device and a voltage change rate of a collector-emitter voltage when the semiconductor device is turned on includes:
a peak portion in which the voltage change rate exhibits a local maximum value; and
a maintaining and increasing region in which the voltage change rate is maintained or increased in a direction in which the collector current is increased from the peak portion.

17. The semiconductor device according to claim 16, wherein in the current-voltage change rate characteristic, the voltage change rate when the collector current is a rated current of the semiconductor device is larger than the voltage change rate when the collector current is 5% of the rated current.

18. The semiconductor device according to claim 16, wherein the current-voltage change rate characteristic has a valley portion in which the voltage change rate exhibits a local minimum value in a region where the collector current is 5% to 100% of a rated current of the semiconductor device.

19. A semiconductor device comprising:
A semiconductor substrate having an upper surface and a lower surface and provided with a drift region of a first conductivity type;
an emitter electrode provided above the upper surface of the semiconductor substrate;
a plurality of trench portions provided on the upper surface of the semiconductor substrate and arranged spaced from each other in an array direction; and
a plurality of mesa portions sandwiched between each of the plurality of trench portions inside the semiconductor substrate, wherein
the plurality of trench portions include a gate trench portion to which a gate voltage is applied,
one mesa portion of two mesa portions in contact with the gate trench portion among the plurality of mesa portions is an active mesa portion in which an emitter region of the first conductivity type having a doping concentration higher than that of the drift region is arranged in contact with the gate trench portion,
an other mesa portion of the two mesa portions in contact with the gate trench portion is a dummy mesa portion not having the emitter region, and
a current-voltage change rate characteristic indicating a relationship between a collector current flowing through the semiconductor device and a voltage change rate of a collector-emitter voltage when the semiconductor device is turned on includes:
a peak portion in which the voltage change rate exhibits a local maximum value; and
a maintaining and increasing region in which the voltage change rate is maintained or increased in a direction in which the collector current is increased from the peak portion.

20. The semiconductor device according to claim 19, wherein in the current-voltage change rate characteristic, the voltage change rate when the collector current is a rated current of the semiconductor device is larger than the voltage change rate when the collector current is 10% of the rated current.

21. The semiconductor device according to claim 19, wherein the current-voltage change rate characteristic has a valley portion in which the voltage change rate exhibits a local minimum value in a region where the collector current is 10% to 100% of a rated current of the semiconductor device.

* * * * *